United States Patent
Yoshimoto et al.

(10) Patent No.: US 8,238,140 B2
(45) Date of Patent: Aug. 7, 2012

(54) SEMICONDUCTOR MEMORY AND PROGRAM

(75) Inventors: Masahiko Yoshimoto, Hyogo (JP); Hiroshi Kawaguchi, Hyogo (JP); Shunsuke Okumura, Hyogo (JP); Hidehiro Fujiwara, Hyogo (JP)

(73) Assignee: The New Industry Research Organization, Hyogo (JP)

( * ) Notice: Subject to any disclaimer, the term of this patent is extended or adjusted under 35 U.S.C. 154(b) by 160 days.

(21) Appl. No.: 12/809,684

(22) PCT Filed: Jan. 7, 2009

(86) PCT No.: PCT/JP2009/050086
§ 371 (c)(1),
(2), (4) Date: Jun. 21, 2010

(87) PCT Pub. No.: WO2009/088020
PCT Pub. Date: Jul. 16, 2009

(65) Prior Publication Data
US 2010/0271865 A1    Oct. 28, 2010

(30) Foreign Application Priority Data
Jan. 7, 2008 (JP) .................... 2008 000357

(51) Int. Cl.
*G11C 11/24* (2006.01)
*G11C 11/00* (2006.01)
*G11C 7/00* (2006.01)
*G11C 7/02* (2006.01)
*G11C 29/00* (2006.01)

(52) U.S. Cl. ........ 365/149; 365/154; 365/156; 365/200; 365/210.1; 714/764; 714/766

(58) Field of Classification Search ............... 365/149, 365/154, 156, 200, 210.1; 714/764, 766
See application file for complete search history.

(56) References Cited

U.S. PATENT DOCUMENTS

| | | | |
|---|---|---|---|
| 6,335,873 B1 * | 1/2002 | Kawaguchi et al. | 365/149 |
| 7,032,142 B2 * | 4/2006 | Fujioka et al. | 365/200 |
| 7,167,403 B2 * | 1/2007 | Riho et al. | 365/200 |
| 7,212,453 B2 * | 5/2007 | Kikutake et al. | 365/200 |
| 7,349,241 B2 * | 3/2008 | Wood | 365/154 |
| 7,385,864 B2 * | 6/2008 | Loh et al. | 365/154 |
| 7,447,950 B2 * | 11/2008 | Takahashi et al. | 365/200 |

FOREIGN PATENT DOCUMENTS

JP    2003-132684 A    5/2003
(Continued)

*Primary Examiner* — Trong Phan
(74) *Attorney, Agent, or Firm* — Ogilvie Law Firm

(57) ABSTRACT

A memory wherein the bit reliability of the memory cells can be dynamically varied depending on the application or the memory status, the operation stability is ensured, and thereby a low power consumption and a high reliability are realized. Either a mode (a 1-bit/1-cell mode) in which one bit is composed of one memory cell or a mode (a 1-bit/n-cell mode) in which one bit is composed of n (n is two or more) connected memory cells is dynamically selected. When the 1-bit/n-cell mode is selected, the read/write stability of one bit is enhanced, the cell current during read is increased (read is speeded up), and a bit error, if occurs, is self-corrected. Especially, a pair of CMOS transistors and a control line for performing control so as to permit the CMOS transistors to conduct are added between the data holding nodes of n adjacent memory cells. With this, the word line (WL) is controlled, and thereby the operation stability is further improved.

22 Claims, 32 Drawing Sheets

FOREIGN PATENT DOCUMENTS

| | | |
|---|---|---|
| JP | 2004-134026 A | 4/2004 |
| JP | 2005-293629 A | 10/2005 |
| JP | 2007-109300 A | 4/2007 |
| JP | 2007-172715 A | 7/2007 |
| JP | 2008-034037 A | 2/2008 |

* cited by examiner

Fig.11
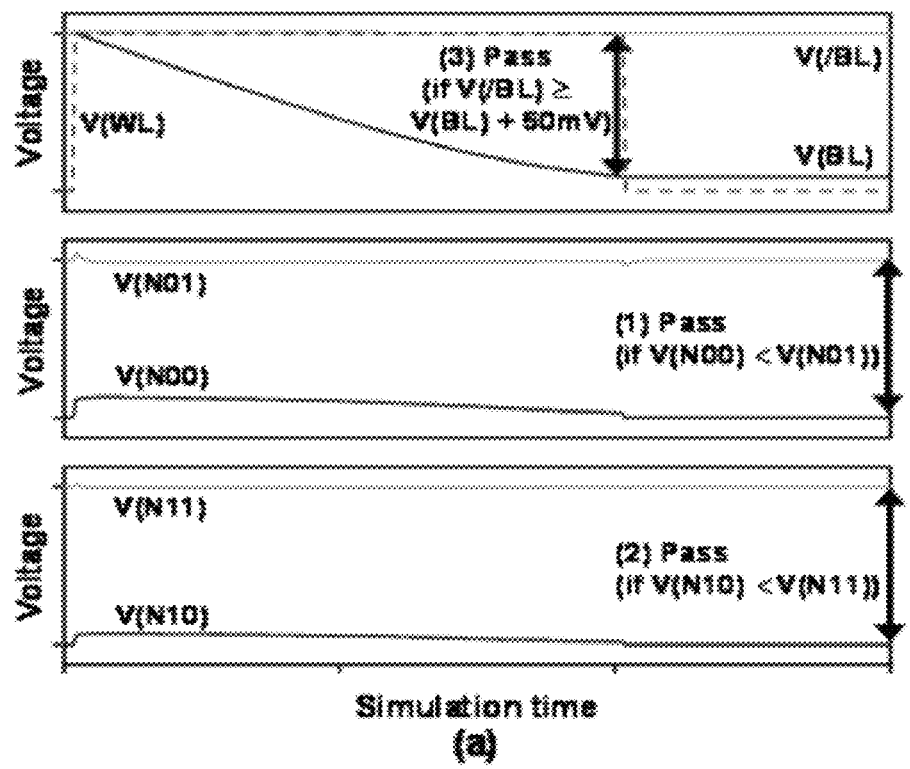
(a)
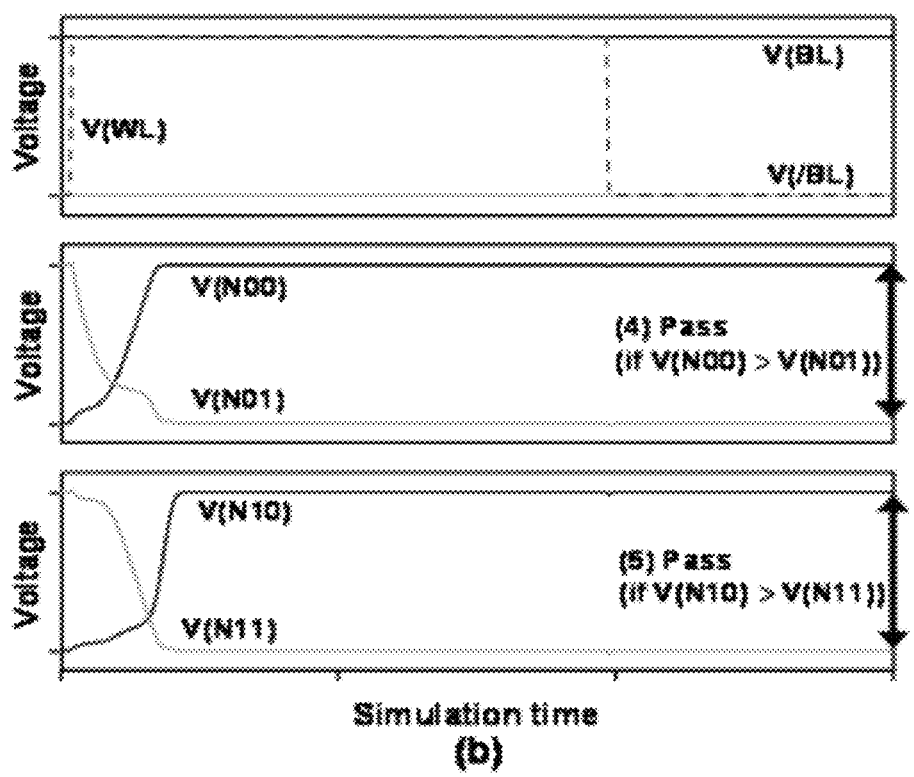
(b)

SEMICONDUCTOR MEMORY AND PROGRAM

TECHNICAL FIELD

The present invention relates to a semiconductor memory with which reliability can be controlled dynamically, and especially relates to a semiconductor memory, with which a QoB (quality of bit) can be changed according to a power consumption amount of the memory, a demand for memory capacity, and a degree of importance of bit reliability, and also relates to a program for driving the memory.

BACKGROUND ART

With recent memories, such as an SRAM (static random access memory), DRAM (dynamic random access memory), etc., advances in CMOS process technologies for SoC (system-on-chip) have lead to reduction of processing dimensions (scaling sizes) of integrated circuits and t his in turn has lead to realization of higher chip densities, lower chip costs, and increased memory capacity. Such reduction of scaling size causes increased variation of a threshold voltage of a transistor making up a memory cell of an SRAM, etc., lowering of read and write noise margins of the memory cell, destabilization of memory cell operation, and increase of bit error rate (BER). Also, soft errors due to cosmic rays are becoming non-negligible due to decreases of circuit operating voltage and noise margins.

FIG. 1 is a graph that shows SRAM operating limit voltages with respect to LSI manufacturing process nodes. The manner in which an operating margin between a standard operating voltage and an operating limit voltage decreases as the LSI manufacturing process node changes from 250 nm to 130 nm and then to 90 nm is shown. It is predicted that as the scaling size is reduced further and the LSI manufacturing process node reaches 65 nm, the relationship between the standard operating voltage and the operating limit voltage will become reversed to cause a sudden increase of bit error rate (BER).

As a measure for reducing the BER, there is a method of increasing a number of transistors in a memory cell. However, with the method of increasing the number of transistors, the memory cell becomes large in area overhead and there is a speed overhead due to an inability to perform differential reading. As another measure for reducing the BER, there is a method of performing voltage control of memory cell operations instead of current control. However, with the method of voltage control, a separate power supply, an additional circuit, etc., are separately required.

Meanwhile, the importance of reliability is dependent on application, and there are applications that require reliability and applications that do not require reliability. A cryptographic process is an example of an application that requires a high reliability. Oppositely, a screensaver process and a video or other moving image process are examples of applications that do not require a high reliability.

FIG. 2 is a schematic arrangement diagram of a conventional SRAM. With the conventional SRAM arrangement, all blocks (BLK 0 to BLK 5 in the figure) have the same reliability. A plurality of memory cells (MC) are present in each block, and one bit is allocated to one memory cell. An arrangement in which one bit is allocated to one memory cell shall hereinafter be defined as a 1-bit/1-cell mode. The reliability of one bit is highly dependent on variation due to process of the transistor that makes up the memory cell.

Also, when the manufacturing process node becomes thin due to scaling, the operating margin decreases, and the process variation comes to have a large influence on the reliability of one bit.

As examples of arts related to the conventional SRAM, Patent Document 1 and Patent Document 2 are known.
[Patent Document 1] JP-A-2005-25863
[Patent Document 2] JP-A-2003-132684

OUTLINE OF THE INVENTION

Problems to be Solved by the Invention

As mentioned above, there is the problem that as the process becomes more microscopically refined, variation of the threshold voltage of the transistor making up the memory cell increases, causing degradation of the operating margins of the memory cells making up the SRAM or other memory and obstructing the operation stability of the memory cells.

On the other hand, a memory is installed in a mobile phone, etc., and there is thus a strong demand for reducing a power consumption amount of the memory and there is also a need to take measures to secure the bit reliability of the memory cells. Also, advances in process technologies are being made at a dizzying pace and a memory capacity of a single chip is increasing dramatically. Also, the demand for reduction of the power consumption amount of the memory, the demand for securing the necessary memory capacity, and the demand for bit reliability differ according to application. That is, the required QoB varies according to application.

An object of the present invention is to provide a memory with which a bit reliability of a memory cell can be varied dynamically according to application and memory status to secure operation stability and realize low power consumption and high reliability.

Means to Solve the Objects

To achieve the above object, a semiconductor memory according to a first aspect of the present invention includes memory cells each in turn including a pair of cross-coupled inverters with respective outputs connected to paths respectively leading to each of a pair of bit lines disposed in correspondence to a column of the memory cells, a pair of switch units disposed between the bit lines and the outputs of the inverters, and a single word line controllable by conduction of the switch units, and with the semiconductor memory, dynamic switching between a mode in which one bit is allocated to one memory cell (1-bit/1-cell mode) and a mode in which one bit is allocated to n (where n is two or more) coupled memory cells (1-bit/n-cell mode) is enabled, and by switching to the 1-bit/n-cell mode, operation stability of one bit is enhanced, a cell current during a read operation is increased (the read operation is made high in speed), and self-correction of bit error is enabled.

With recent memories, such as an SRAM, DRAM, etc., with which advances are being made in terms of microscopic refinement, large scale integration, and high functionality, it is difficult to completely eliminate physical errors (randomly occurring errors) and human errors (errors due to shipping a product with errors, which occurred in design, manufacturing, and inspection processes, being contained therein). It is thus necessary to stand on a premise that errors are always present and construct a system that can improve on errors even if they are present.

Meanwhile, a reliability of a memory is influenced by operating speed, operating voltage, temperature environment, soft errors due to cosmic rays, and other variations of an operating environment. The reliability of a memory also differs according to systematic factors, such as manufacturing process, locations of memory cells, etc. Also as mentioned above, the importance of the reliability of a memory depends on the application, there are applications that require reliability and applications that do not require reliability, and the required reliability differs according to program codes and data that are stored in the memory. That is, whereas there are applications such as cryptographic programs, cryptographic data, etc., that require a memory to have an extremely high reliability, there are also applications such as desktop screensaver programs and data thereof that do not require reliability of the memory in particular.

With the semiconductor memory according to the first aspect of the present invention, dynamic switching between the 1-bit/1-cell mode and the 1-bit/n-cell can be performed and thus a program, such as an OS (operating system), can control the reliability of allocated memory space in accordance with the operating environment (operating speed, operating voltage, temperature environment, soft errors) and a memory occupancy that varies. That is, high reliability is obtained by dynamically switching between the 1-bit/1-cell mode and the 1-bit/n-cell mode according to the operating environment (operating speed, operating voltage, temperature environment, soft errors), or proactively setting the 1-bit/n-cell mode when the memory occupancy is low. For example, although when a mobile phone becomes low in battery, an operating margin decreases due to lowering of the operating voltage of the memory cells, with the semiconductor memory according to the first aspect of the present invention, the operating margin can be improved and the read/write stability of one bit can be enhanced by dynamically switching to the 1-bit/n-cell mode.

Also, by switching to the 1-bit/n-cell mode, the cell current for the read operation can be increased. That is, the read operation can be made high in speed.

Although the memory cell arrangement in the semiconductor memory according to the first aspect of the present invention is a typical circuit arrangement of a conventional SRAM, by using the memory cells of the conventional arrangement in a mode where n memory cells (where n is two or more) are couplingly arranged (1-bit/n-cell mode), self-correction of bit errors can be performed.

Also with the semiconductor memory according to the first aspect of the present invention, the self-correction of bit errors can be performed and thus memory cells that are found to be of low margin during manufacture or inspection can be set to the 1-bit/n-cell mode to secure the reliability of the memory. Also, memory cells that are detected to be of low margin during operation can be set dynamically to the 1-bit/n-cell mode to secure the reliability of the memory.

Further with the semiconductor memory according to the first aspect of the present invention, information (program codes and data) held in the memory cells can be deleted instantaneously by switching from the 1-bit/1-cell mode to the 1-bit/n-cell mode. For example, from the standpoint of security, information can be deleted by a timed operation using a timer.

As described above, with the semiconductor memory according to the first aspect of the present invention, the bit reliability of the memory cells can be varied dynamically according to application and memory status to secure operation stability and enable realization of low power consumption and high reliability.

Also, a semiconductor memory according to a second aspect of the present invention is arranged so that with the memory cells of the conventional SRAM arrangement, the 1-bit/n-cell mode has an arrangement where a pair of N-type MOS transistors and a single control line capable of controlling the N-type MOS transistors to conduct are further added between data holding nodes of adjacent memory cells.

By this memory cell arrangement, the read/write operation stability of one bit can be enhanced to improve the operating margin and improve the operating speed. Also, self-correction of bit errors can be performed.

Also, a semiconductor memory according to a third aspect of the present invention is arranged so that with the memory cells of the conventional SRAM arrangement, the 1-bit/n-cell mode has an arrangement where a pair of P'-type MOS transistors and a single control line capable of controlling the P-type MOS transistors to conduct are further added between data holding nodes of adjacent memory cells.

By this memory cell arrangement, the read/write operation stability of one bit can be enhanced to improve the operating margin and improve the operating speed. Also, self-correction of bit errors can be performed. The read/write operation stability of one bit, the operating margin, and the operating speed differ according to whether the pair of MOS transistors disposed between the data holding nodes of the memory cells are of the N type or the P type, and the details thereof shall be described below by way of embodiments.

Also, a semiconductor memory according to a fourth aspect of the present invention is arranged so that with the memory cells of the conventional SRAM arrangement, the 1-bit/n-cell mode has an arrangement where a pair of CMOS switches and a single control line capable of controlling the CMOS switches to conduct are further added between data holding nodes of adjacent memory cells.

Also, a semiconductor memory according to a fifth aspect of the present invention is arranged so that with the memory cells of the conventional SRAM arrangement, the 1-bit/n-cell mode has an arrangement where a single CMOS switch and a single control line capable of controlling the CMOS switch to conduct are further added between data holding nodes of adjacent memory cells.

Also, a semiconductor memory according to a sixth aspect of the present invention is arranged so that with the memory cells of the conventional SRAM arrangement, the 1-bit/n-cell mode has an arrangement where a pair of switch units are further added between data holding nodes of adjacent memory cells.

Also with the semiconductor memory according to each of the second to fourth aspects, in a case where n is 2 in the 1-bit/n-cell mode (1-bit/2-cell mode), the stability of the data read operation can be enhanced by making only one word line among the two word lines of the two memory cells transition to a high level.

Also with the semiconductor memory according to each of the second to fourth aspects, in the case of the 1-bit/2-cell mode, the cell current during the read operation can be increased more to enable the speed of the read operation to be made higher and the stability of the data read operation can be enhanced when only one word line among the two word lines of the two memory cells is made to transition to the high level than when the two word lines are made to transition to the high level.

Also with the semiconductor memory according to each of the second to fourth aspects, in the case where n is 2 in the 1-bit/n-cell mode (1-bit/2-cell mode), the stability of the data write operation can be enhanced by making the two word lines among the two word lines of the two memory cells transition to the high level.

Also with the semiconductor memory according to each of the second to fourth aspects, in the case of the 1-bit/2-cell mode, the stability of the data write operation can be enhanced more when the two word lines among the two memory cells are made to transition to the high level than when only one of the word lines is made to transition to the high level.

Here, the switching between the 1-bit/1-cell mode and the 1-bit/n-cell mode is preferably performed in memory block units. This is in consideration of design of peripheral circuits (XY-decoder circuit, sensor amp circuit). Besides performing mode switching in block units, the mode switching may also be performed in row units or column units. However, when the units of control become too fine as in the case of row units, column units, etc., the control method becomes complex and it is thus considered appropriate to perform mode switching in block units.

A semiconductor memory according to a seventh aspect of the present invention includes memory cells each in turn including a capacitor for storing charges, an access transistor controlling charging and discharging of charges into and from the capacitor, and a single word line capable of controlling the access transistor, and with the semiconductor memory, dynamic switching between a mode in which one bit is allocated to one memory cell (1-bit/1-cell mode) and a mode in which one bit is allocated to n (where n is two or more) coupled memory cells (1-bit/n-cell mode) is enabled, and by switching to the 1-bit/n-cell mode, operation stability of one bit is enhanced, a cell current during a read operation is increased (the read operation is made high in speed), and self-correction of bit error is enabled.

Although the memory cell arrangement in the semiconductor memory according to the seventh aspect of the present invention is a typical circuit arrangement of a conventional DRAM, by using the memory cells of the conventional DRAM arrangement in a mode where n memory cells (where n is two or more) are couplingly arranged (1-bit/n-cell mode), variation among the capacitors that hold the data can be compensated.

Also, a semiconductor memory according to an eighth aspect of the present invention is arranged so that with the memory cells of the conventional DRAM arrangement, the 1-bit/n-cell mode has an arrangement where a single CMOS switch and a single control line capable of controlling the CMOS switch to conduct are further added between data holding nodes of adjacent memory cells. By this arrangement, the variation among the capacitors that hold the data can be compensated in comparison to memory cells with the conventional DRAM arrangement.

Also, a semiconductor memory according to a ninth aspect of the present invention is arranged so that with the memory cells of the conventional DRAM arrangement, the 1-bit/n-cell mode has an arrangement where a single N-type MOS transistor and a single control line capable of controlling the N-type MOS transistor to conduct are further added between data holding nodes of adjacent memory cells. By this arrangement, the variation among the capacitors that hold the data can be compensated in comparison to memory cells with the conventional DRAM arrangement.

Also, a semiconductor memory according to a tenth aspect of the present invention is arranged so that with the memory cells of the conventional DRAM arrangement, the 1-bit/n-cell mode has an arrangement where a single switch unit is further added between data holding nodes of adjacent memory cells. By this arrangement, the variation among the capacitors that hold the data can be compensated in comparison to memory cells with the conventional DRAM arrangement.

A program according to the present invention shall now be described. The program according to the present invention is, for example, a system call function of an OS and makes a computer execute the step described below to make the semiconductor memory according to the present invention exhibit the function of dynamically varying the reliability efficiently.

First, a program according to a first aspect of the present invention makes the computer execute a step of switching from the 1-bit/1-cell mode to the 1-bit/n-cell mode when a memory occupancy is no more than a predetermined threshold.

By the program of the first aspect, switching to the 1-bit/n-cell mode can be performed proactively when the memory occupancy is low to thereby provide a high reliability.

A program according to a second aspect of the present invention makes the computer execute the step of switching from the 1-bit/1-cell mode to the 1-bit/n-cell mode when a remaining battery amount falls to no more than a predetermined threshold.

By the program of the second aspect, when, in a mobile phone, etc., the remaining battery amount falls to no more than the predetermined threshold and the operating voltage of the memory falls, switching to the 1-bit/n-cell mode is performed to enable the operating margin to be increased and the operation stability to be enhanced.

A program according to a third aspect of the present invention makes the computer execute the step of switching from the 1-bit/1-cell mode to the 1-bit/n-cell mode when an operating speed or an operating voltage of the memory cells falls to no more than a predetermined threshold.

By the program of the third aspect, when the operating speed or the operating voltage of the memory cells falls to no more than the predetermined threshold, switching to the 1-bit/n-cell mode is performed to enable the operating speed for one bit to be improved and the operating margin to be improved.

A program according to a fourth aspect of the present invention makes the computer execute the step of switching from the 1-bit/1-cell mode to the 1-bit/n-cell mode when an operating margin of the memory cells falls to no more than a predetermined threshold.

By the program of the fourth aspect, when the operating margin of the memory cells falls to no more than the predetermined threshold, switching to the 1-bit/n-cell mode is performed to enable the operating margin for one bit to be improved.

A program according to a fifth aspect of the present invention makes the computer execute the step of switching from the 1-bit/1-cell mode to the 1-bit/n-cell mode or from the 1-bit/n-cell mode to the 1-bit/1-cell mode when a condition with which a hold state of the memory cells is to be cancelled is established.

By the program of the fifth aspect, when a condition with which the hold state of the memory cells is to be cancelled is established, for example, due to execution of deletion of information by a system call of an OS or a timed operation executed from the standpoint of security, switching from the 1-bit/1-cell mode to the 1-bit/n-cell mode or from the 1-bit/n-cell mode to the 1-bit/1-cell mode is performed to enable the held information to be deleted instantaneously.

Effects of the Invention

By the semiconductor memory according to the present invention, the bit reliability of memory cells can be varied dynamically according to application and memory status, thereby providing effects of promoting stabilization and speedup of operation and realization of low power consumption and high stability.

BRIEF DESCRIPTION OF THE DRAWINGS

FIG. 11 shows simulation waveforms in read/write operations.

BEST MODE(S) FOR CARRYING OUT THE INVENTION

Hereinafter, embodiments of the present invention will be described in detail with reference to the drawings.

Figure 1:
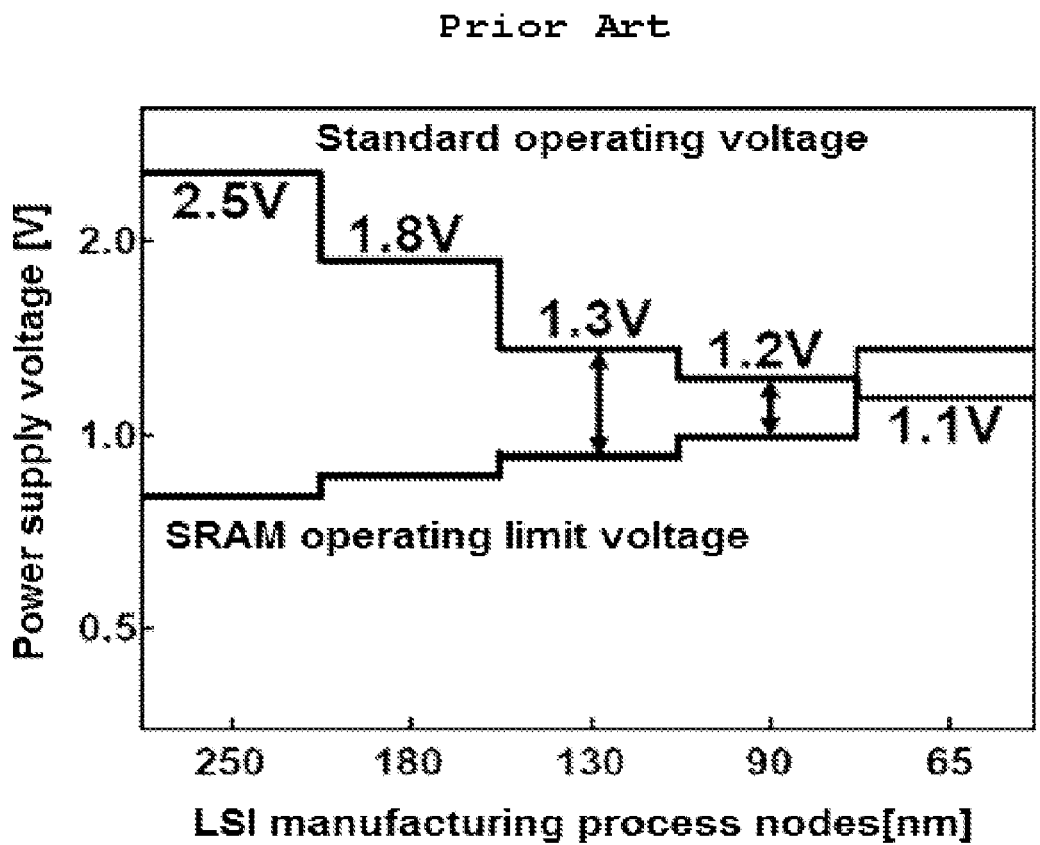
FIG. 1 is an explanatory diagram of an operating limit of a conventional SRAM.
Figure 2:
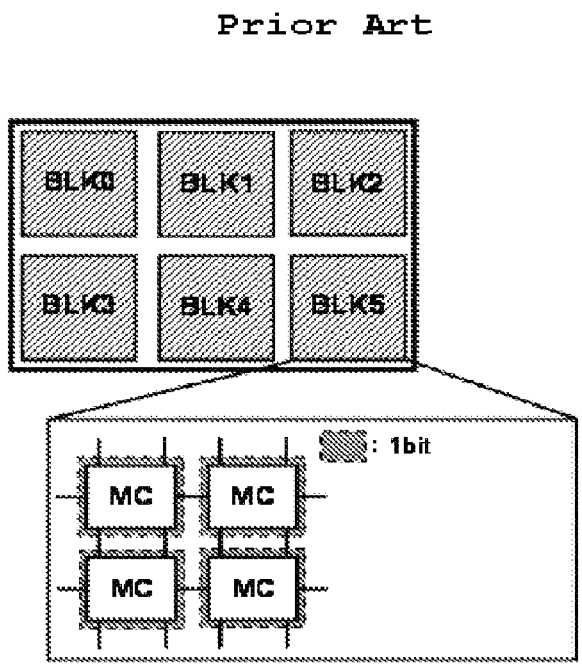
FIG. 2 is a schematic arrangement diagram of the conventional SRAM.
Figure 3:
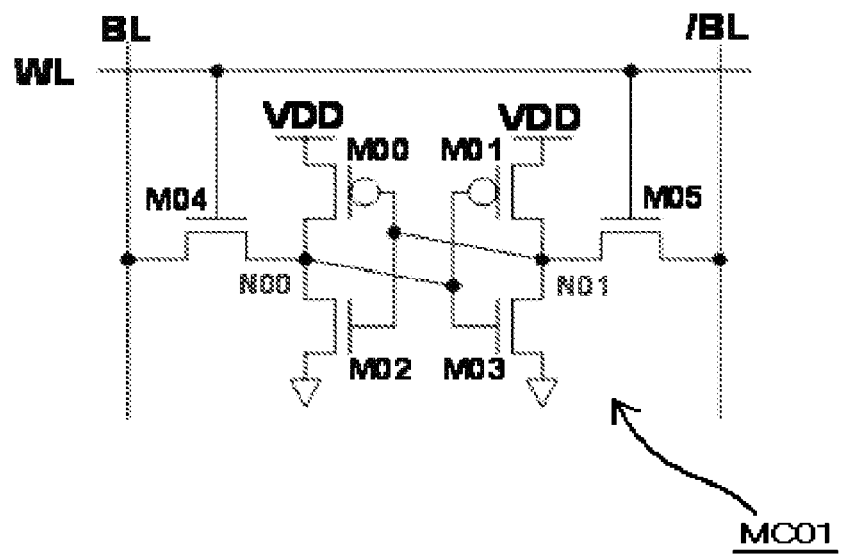
FIG. 3 is a circuit diagram of an example of an arrangement of a memory cell used in the conventional SRAM.

FIG. 3 is a circuit diagram of an example of an arrangement of a memory cell used in a conventional SRAM. The SRAM memory cell (MC01) shown in FIG. 3 includes a latch circuit made up of a P-type MOS transistor (M00) and an N-type MOS transistor (M02) connected in series between a power supply potential VDD and a ground potential VSS and a P-type MOS transistor (M01) and an N-type MOS transistor (M03) connected in series between the power supply potential VDD and the ground potential VSS.

Gate terminals of the P-type MOS transistor (M00) and the N-type MOS transistor (M02) are both connected to a node (N01) of the P-type MOS transistor (M01) and the N-type MOS transistor (M03). Also, gate terminals of the P-type MOS transistor (M01) and the N-type MOS transistor (M03) are both connected to a node (N00) of the P-type MOS transistor (M00) and the N-type MOS transistor (M02). The transistors M00 to M03 are thus cross-couple connected, and thus the P-type MOS transistors (M00 and M01) operate as load transistors and the N-type MOS transistors (M02 and M03) operate as drive transistors.

The memory cell (MC01) also includes N-type MOS transistors (M04 and M05) as switch units respectively connected between complementary bit lines (BL and /BL) and the nodes (N00 and N01). The gate terminals of the N-type MOS transistors (M04 and M05) are connected to a common word line (WL), and gate potentials of the N-type MOS transistors (M04 and M05) are controlled by the word line (WL).

With the memory cell used in the conventional SRAM, the P-type MOS transistors (M00 and M01) are the load transistors, the N-type MOS transistors (M02 and M03) are the drive transistors, the N-type MOS transistors (M04 and M05) are the switch units, and the SRAM memory cell is thus made up of six MOS transistors.

Operations of the SRAM memory cell (MC01) shall now be described. First, as an example of a read operation of the SRAM memory cell (MC01), a read operation in a case where, in the SRAM memory cell (MC01), the node (N00) is at a low level "L" and the node (N01) is at a high level "H" shall be described. Before the read operation of the SRAM memory cell (MC01), the bit lines (BL and /BL) are set to the high level "H" by application of the power supply potential VDD for just a predetermined pre-charging period with the low level "L" being applied to the word line (WL).

Charging of wiring capacitance is thereby performed in the bit lines (BL and /BL) so that the power supply potential VDD is substantially held even after completion of the pre-charging period. After completion of the pre-charging period, the word line (WL) is made to transition from the low level "L" to the high level "H" to perform the read operation. A read current thus flows in the direction of the ground potential VSS from the bit line (BL) via the N-type MOS transistor (M04) and the N-type MOS transistor (M02), and the potential of the bit line (BL) transitions from the high level "H" to the low level "L."

By the flowing of the read current, the voltage at the node (N00) rises from the low level "L" in accordance with proportions of on resistances of the N-type MOS transistor (M02) and the N-type MOS transistor (M04).

The potential of the bit line (/BL) is maintained in the high level "H" state and the potentials of the bit lines (BL and /BL) are thus set at the low level "L" and the high level "H" respectively. This state is detected by a sense amp (not shown) that uses the bit lines (BL and /BL) as a differential input, and a stored content of the SRAM memory cell (MC01) is thereby read out to the exterior.

Here, the voltage at the node (N00) must be prevented from exceeding a threshold voltage at which an inverter formed by the P-type MOS transistor (M01) and the N-type MOS transistor (M03) inverts. A conductance of the N-type MOS transistor (M02) must thus be set larger than a conductance of the N-type MOS transistor (M04) (M02>M04).

Next, as an example of a write operation, a write operation in a case where, in the SRAM memory cell (MC01), the node (N00) is in the high level "H" state and the node (N01) is in the low level "L" state before the write operation, and the node (N00) is rewritten to the low level "L" and the node (N01) is rewritten to the high level "H" shall be described.

First, the low level "L" is applied to the bit line (BL) and the high level "H" is applied to the bit line (/BL) by a write amp (not shown): Also, the high level "H" is applied to the word line (WL). In the SRAM memory cell (MC01), the switch unit arranged from the N-type'MOS transistors (M04 and M05) is thereby made to conduct, and a write current flows in the direction of the bit line (BL) from the power supply potential VDD via the P-type MOS transistor (M00) and the N-type MOS transistor (M04). By the flowing of the write current, the voltage at the node (N00) decreases from the high level "H" in accordance with the proportions of the on resistances of the P-type MOS transistor (M00) and the N-type MOS transistor (M04).

Here, the voltage at the node (N00) must be made to fall below the threshold voltage at which the inverter formed by the P-type MOS transistor (M01) and the N-type MOS transistor (M03) inverts. The conductance of the P-type MOS transistor (M00) must thus be set smaller than the conductance of the N-type MOS transistor (M04) (M04>M00).

When the voltage at the node (N00) falls below the threshold voltage, the voltage at the node (N01) is inverted from the low level "L" to the high level "H," the output of the inverter formed by the P-type MOS transistor (M00) and the N-type MOS transistor (M02) is thus inverted from the high level "H" level to the low level "L," and the write operation of the SRAM memory cell (MC01) is thereby completed.

As mentioned above, in the SRAM memory cell (MC01), from the conductance condition in the read operation (M02>M04) and the conductance condition in the write operation (M04>M00), a relationship, (M02>M00), holds as a conductance condition. With this conductance condition, the threshold voltage of the inverter formed by the P-type MOS transistor (M00) and the N-type MOS transistor (M02) falls below ½ of the normal power supply voltage. Thus, when the power supply voltage is decreased by the making of the power supply voltage low in recent semiconductor integrated circuits, the threshold voltage of the inverter of the SRAM memory cell (MC01) also falls in a relative manner. When the threshold voltage falls below a static noise level, an error occurs in which a stored content of the memory cell changes due to inversion of the inverter of the memory cell.

For securing the stored content holding property of the memory cell, there is a method of raising the threshold voltage, and for example, the threshold voltage can be raised by making the conductances of the P-type MOS transistor (M00) and the N-type MOS transistor (M02) substantially equal as a conductance condition. However, due to process variations, etc., it is difficult to perform the read/write operations in a stable manner in a case where the conductance condition in the read operation (M02>M04) cannot be satisfied or in a case where the conductance condition in the write operation (M04>M00) cannot be satisfied.

In memory cell embodiments described below, stored contents can be held reliably in memory cells and read/write operations on memory cells can be stabilized in comparison to conventional memory cells even in a case of low power supply voltage.

Embodiment 1

Figure 4:
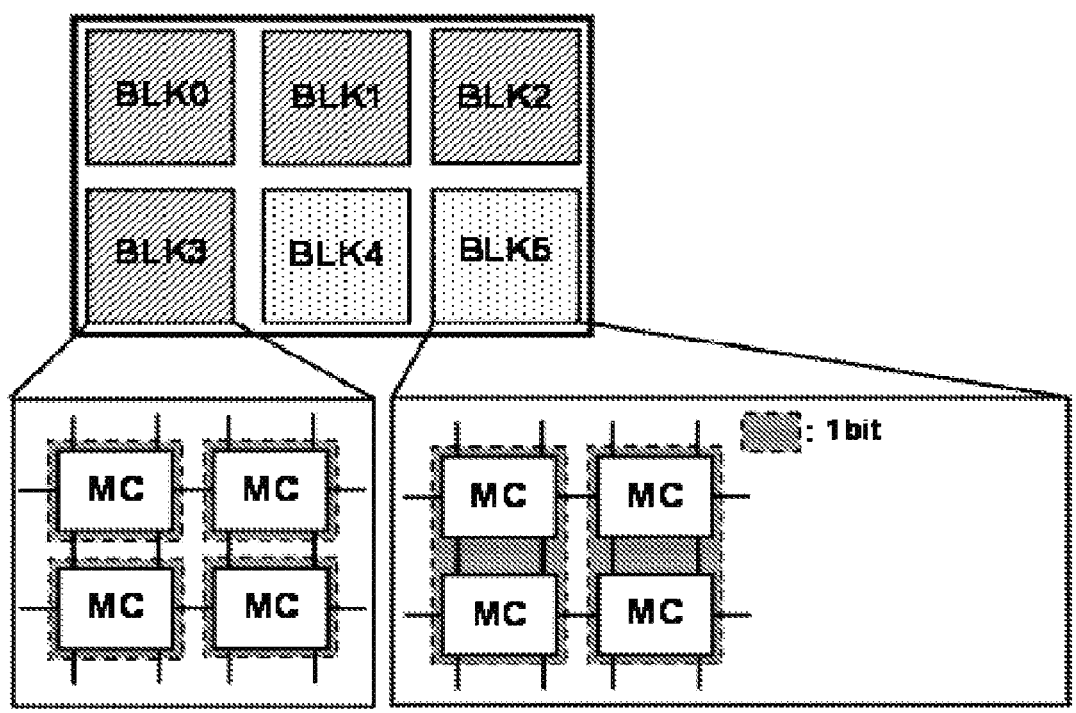
FIG. 4 is an arrangement diagram of a semiconductor memory according to Embodiment 1.

FIG. 4 is an arrangement diagram of a semiconductor memory according to Embodiment 1. In FIG. 4, whereas blocks (BLK0 to BLK3) are blocks that operate in a mode in which one bit is allocated to one memory cell (1-bit/1-cell mode), blocks (BLK4 and BLK5) are blocks that operate in a mode in which one bit is allocated to two coupled memory cells (1-bit/2-cell mode). The blocks (BLK0 to BLK3) of the 1-bit/1-cell mode do not store important program codes and data, such as those of a cryptographic program and cryptographic data, and such important program codes and data are stored in the blocks (BLK4 and BLK5) of the 1-bit/2-cell mode. In comparison to the blocks (BLK0 to BLK3) of the 1-bit/1-cell mode, the blocks (BLK4 and BLK5) of the 1-bit/2-cell mode are halved in memory capacity but realize an excellent QoB. A method for controlling the QoB shall now be described.

Figure 5:
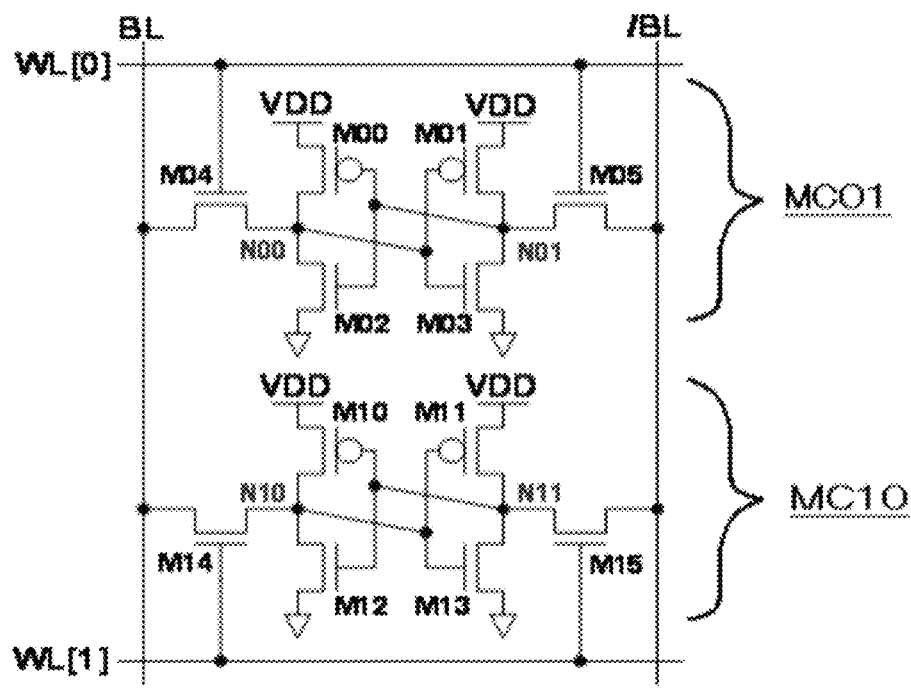
FIG. 5 is a circuit arrangement diagram in which two memory cells of the semiconductor memory according to Embodiment 1 are coupled.

The semiconductor memory of Embodiment 1 has a circuit arrangement where two memory cells used in the conventional SRAM described above are coupled as shown in FIG. 5.

That is, each of the memory cells (MC01 and MC10) according to Embodiment 1 is made up of a pair of cross-coupled inverters (formed by MOS transistors M00 to M03 or by MOS transistors M10 to M13) with respective outputs connected to paths respectively leading to each of the pair of bit lines (BL and /BL) disposed in correspondence to a column of the memory cells, a pair of switch uni is (formed by MOS transistors M04 and M05 or by MOS transistors M14 and M15) disposed between the bit lines (BL and /BL) and the outputs of the inverters, and a single word line (WL[0] or WL[1]) controllable by conduction of the switch units. The two memory cells (MC01 and MC10) are coupled as a 1-bit region to form a 1-bit/2-cell mode block (BLK4 or BLK5). On the other hand, in each of the 1-bit/1-cell mode blocks (BLK0 to BLK3), one memory cell is a 1-bit region.

In the 1-bit/2-cell mode in which the two coupled memory cells (MC01 and MC10) are handled as the 1-bit region, the two memory cells (MC01 and MC10) hold the same data, and thus in the read/write operations, the two word lines (WL[0] and WL[1]) are driven to a high mode "H" (WL[0]="H" and WL[1]="H").

In both the 1-bit/1-cell mode and the 1-bit/2-cell mode, the same processes are performed for reading access and writing access with the exception of the control of the word lines.

Advantages of the 1-bit/2-cell mode shall now be described with reference to FIG. 6 and FIG. 7.

Figure 6:
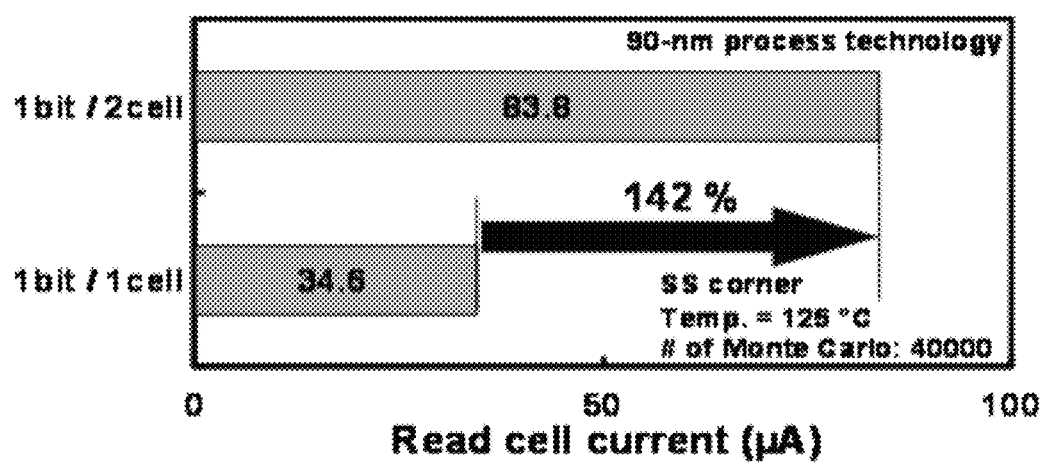
FIG. 6 is a graph comparing read currents in a 1-bit/1-cell mode and a 1-bit/2-cell mode.

FIG. 6 is a graph of results of a comparison using a Monte Carlo simulation of read currents in the 1-bit/1-cell mode and the 1-bit/2-cell mode in memory cells made by 90 nm process technology.

The graph of FIG. 6 shows that the read current of the 1-bit/2-cell mode is no less than two times the read current of the 1-bit/1-cell mode and is thus increased in cell current (improved in operating speed).

In the case of the memory cells of Embodiment 1 (1-bit/2-cell mode), even if a memory cell that is accessed is defective, as long as one memory cell among the two memory cells is normal and the data content held thereby is correct, the data content held by the defective memory cell can be corrected by the data content held by the normal memory cell.

Figure 7:
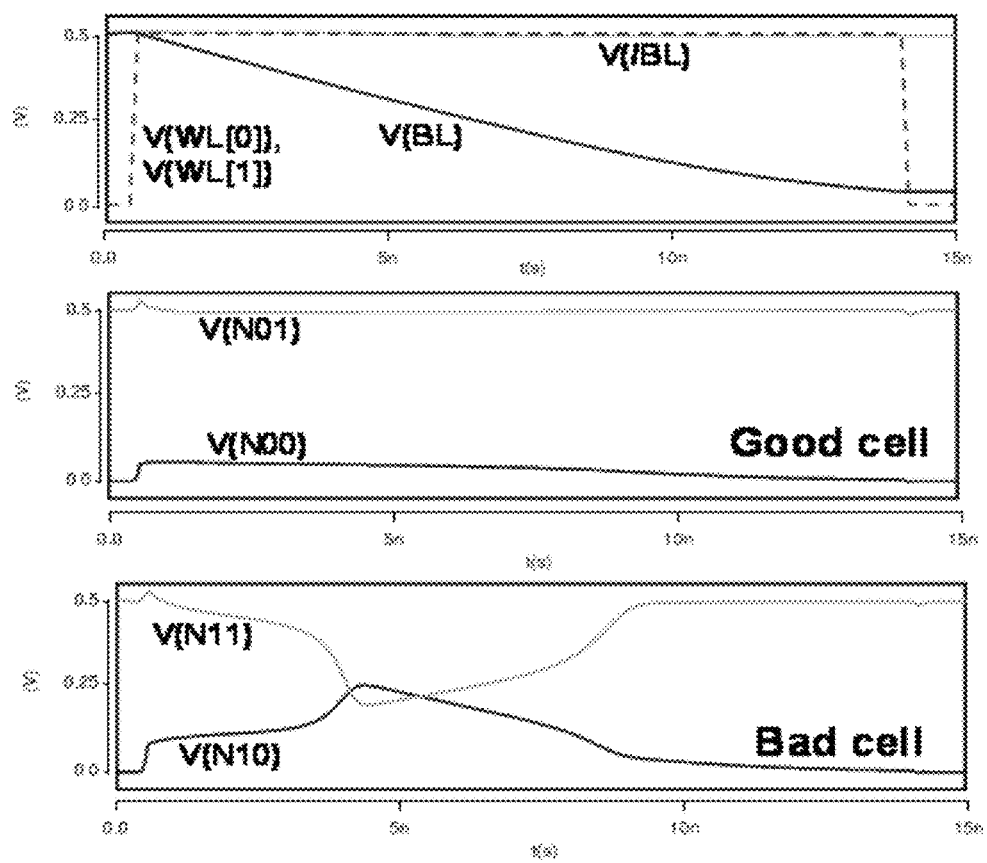
FIG. 7 is an explanatory diagram of a self-correcting function in the memory cells of Embodiment 1.

The graph of FIG. 7 explains this self-correcting function and shows manners of transition of node potentials (N00, N01, N10, and N11) with respect to variations of potentials of the bit lines (BL and /BL) and the word lines (WL[0] and WL[1]). Here, MC01 is a normal memory cell, and MC10 is a defective memory cell. Even when the data content of the defective memory cell MC10 is destroyed in the read operation, the bit line levels are set correctly (BL="L" and /BL="H") by the normal memory cell MC01 and the original data content is thus restored in MC10 by influence of the potential difference of the bit lines.

Figure 8:
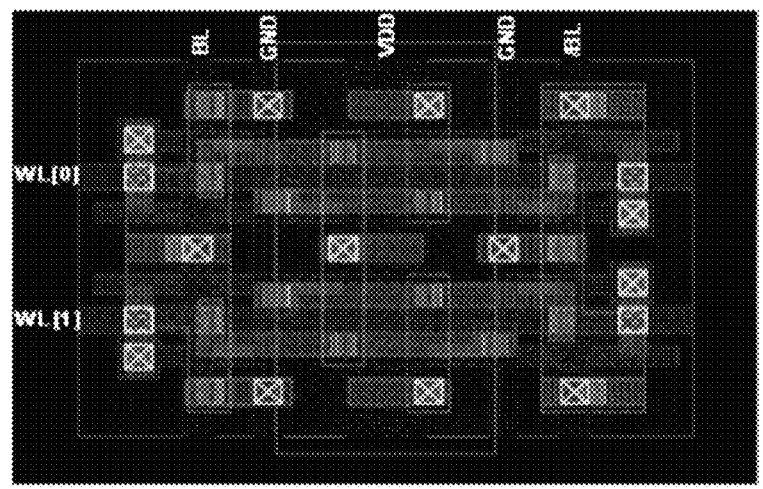
FIG. 8 is a layout diagram of memory cells in a 1-bit region of Embodiment 1.

FIG. 8 is a layout diagram of the memory cells in the 1-bit region of Embodiment 1. There is no area overhead in comparison to a layout area of memory cells used in the conventional SRAM.

Here, the QoB of the 1-bit/2-cell mode is evaluated using a bit error rate (BER) obtained by stability simulation of dynamic cells made by 90 nm process technology.

Figure 9:
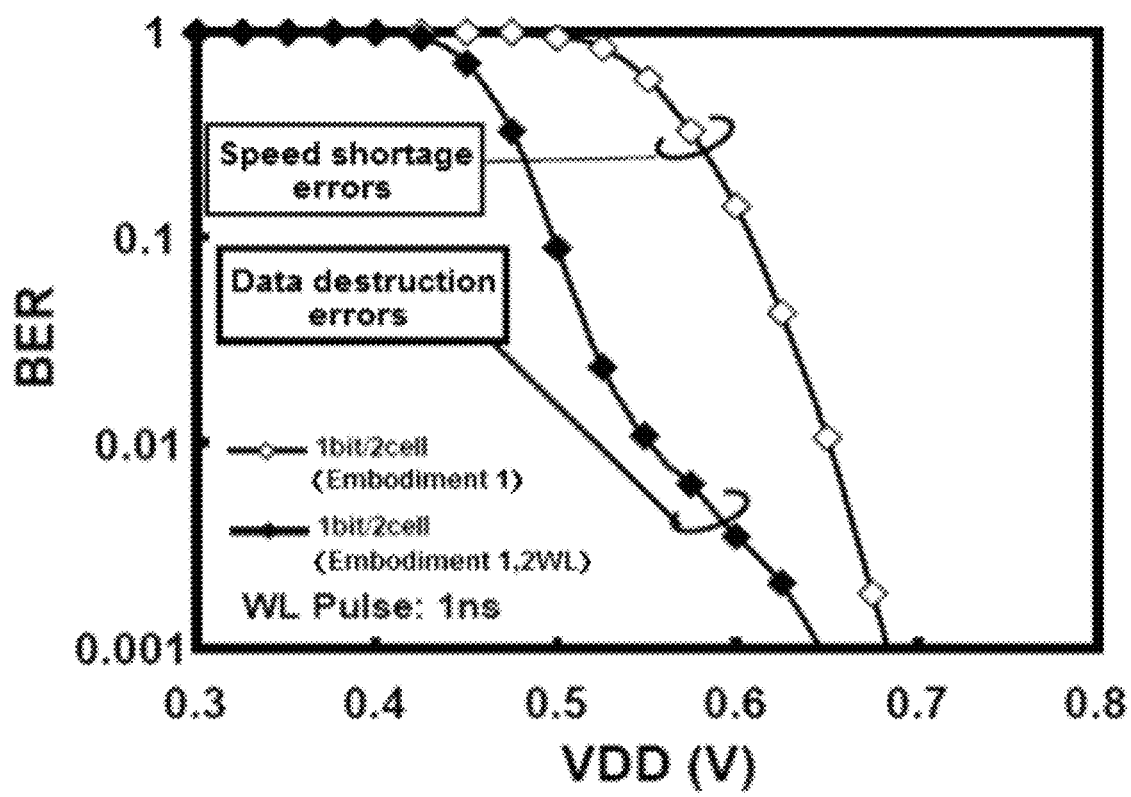
FIG. 9 is a graph of simulation results comparing BERs in read operations in memory cells in the 1-bit/2-cell mode in Embodiment 1 and memory cells in the conventional SRAM (in cases of performing the read operations at high speed).
Figure 10:
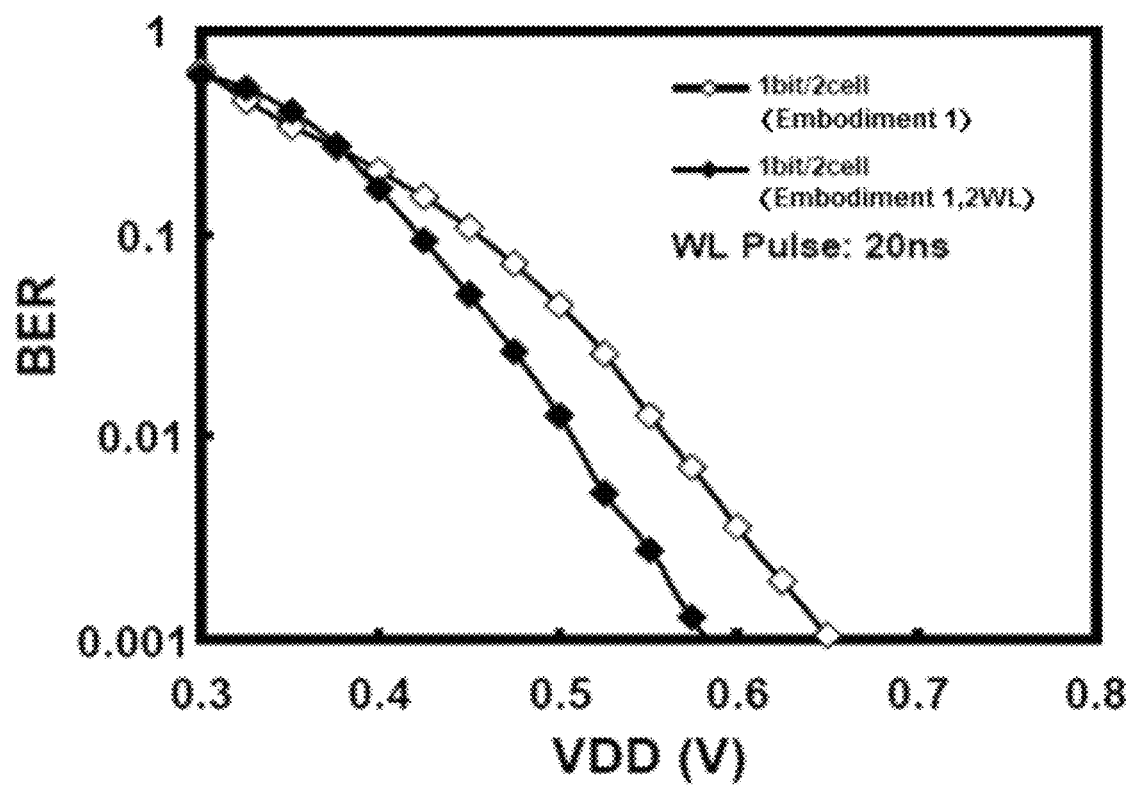
FIG. 10 is a graph of simulation results comparing BERs in read operations in memory cells in the 1-bit/2-cell mode in Embodiment 1 and memory cells in the conventional SRAM (in cases of performing the read operations at low speed).

The graphs of FIG. 9 and FIG. 10 show simulation results comparing BERs in read operations in memory cells in the 1-bit/2-cell mode in Embodiment 1 and memory cells in the conventional SRAM. The graph of FIG. 9 shows the results of performing the read operations at high speed, or to be more specific, in cases where a pulse width in the word line (WL) is 1 ns. The graph of FIG. 10 shows the results of performing the read operations at low speed, or to be more specific, in cases where the pulse width in the word line (WL) is 20 ns.

The graph of FIG. 9 (comparison of high-speed operations) shows that with the memory cells of the 1-bit/2-cell mode in Embodiment 1, the operating speed is improved by raising the levels of two word lines (WL). Specifically, the graph of FIG. 9 shows that a voltage at which the BER is $10^{-3}$ is improved by 50 mV.

Also, the graph of FIG. 10 (comparison of low-speed operations) shows that with the memory cells of the 1-bit/2-cell mode in Embodiment 1, low voltage operation is enabled by the self-correcting function in comparison to the memory cells of the conventional SRAM (1-bit/1-cell mode). Specifically, the graph of FIG. 10 shows that the voltage at which the BER is $10^{-3}$ is improved by 80 mV.

For the simulation, the simulation waveforms in read/write operations shown in FIG. 11 are used. FIG. 11A shows the simulation waveforms in the read operations, and FIG. 11B shows the simulation waveforms in the write operations. Passing conditions of the simulation are indicated in (1) to (5) below. With the write operations, differences were not seen between the memory cells of the conventional SRAM and the memory cells of the 1-bit/2-cell mode of Embodiment 1.

a) For the read operations $$V(N00)<V(N01) \quad (1)$$

$$V(N10)<V(N11) \quad (2)$$

$$V(/BL)>=V(BL)+50 \text{ mV} \quad (3)$$

b) For the write operation in the 1-bit/1-cell mode $$V(N00)>V(N01) \quad (4)$$

c) For the write operation in the 1-bit/2-cell mode $$V(N00)>V(N01) \quad (4)$$

$$V(N10)>V(N11) \quad (5)$$

From the above, it can be understood that the drive method of raising the levels of two word lines (WL[0] and WL[1]) in the memory cells in the 1-bit/2-cell mode in Embodiment 1 realizes a high QoB and is advantageous in comparison to the drive method of the conventional memory cells (1-bit/1-cell mode).

Embodiment 2

Next, a semiconductor memory according to Embodiment 2 is arranged from memory cells with which the reliability can be increased further in comparison to the memory cells of the semiconductor memory of Embodiment 1.

Figure 12:
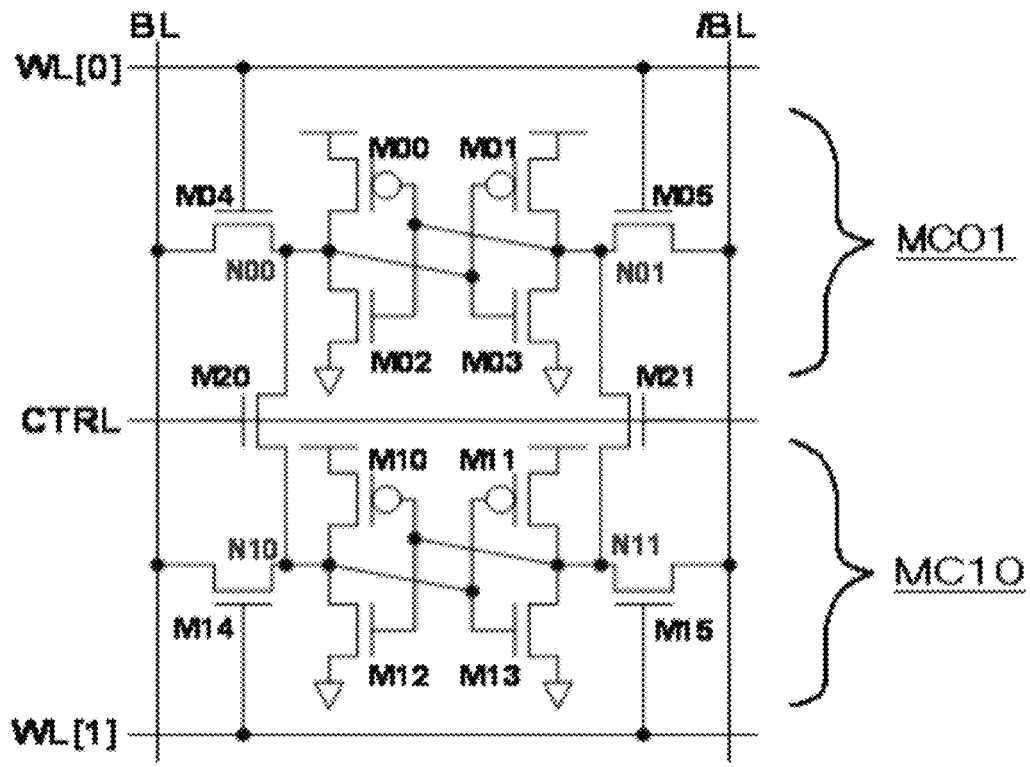
FIG. 12 is a circuit arrangement diagram of memory cells according to Embodiment 2.

FIG. 12 is a circuit arrangement diagram of the memory cells according to Embodiment 2. As shown in FIG. 12, the memory cells in the semiconductor memory of Embodiment 2 have an arrangement where a pair of N-type MOS transistors (M20 and M21) and a single control line (CTRL) capable of controlling the N-type MOS transistors (M20 and M21) to conduct are added between the data holding nodes (between N00 and N10 and between N01 and N11) of the memory cells (MC01 and MC10) according to Embodiment 1.

With the memory cells of Embodiment 2, when the control line (CTRL) is at the low level "L," the added pair of N-type MOS transistors (M20 and M21) are inactive and the intervals between the data holding nodes (between N00 and N10 and between N01 and N11) are in an interrupted state. When from this interrupted state, the level of one of the word lines (WL) is raised (WL[0]="H," WL[1]="L") in a read/write access process, the arrangement becomes equivalent to that of the conventional memory cells and the QoB is low as in the conventional arrangement. Also, when from the interrupted state, the levels of the two word lines (WL) are raised (WL[0]="H," WL[1]="H") in the read/write access process, the arrangement becomes equivalent to that of the memory cells of Embodiment 1 and a high QoB can be realized.

Meanwhile, with the memory cells of Embodiment 2, when the level of the control line (CTRL) is set to the high level "H" and the added pair of N-type MOS transistors (M20 and M21) become active, the intervals between the data holding nodes (between N00 and N10 and between N11 and N11) become directly connected and variations of the memory cells during the read/write operation can be corrected. If one of the memory cells is a normal memory cell, even if the other memory cell is a defective cell, the rising of the potential of the "L" level of the defective cell can be suppressed because the added N-type MOS transistors are conducting.

Also, with the memory cells of Embodiment 2, when the level of one of the word lines (WL) rises (WL[0]="H," WL[1]="L") with the control line (CTRL) being at the high level "H," the read stability is enhanced and a high QoB can be realized. Also, when the levels of the two word lines (WL) rise (WL[0]="H," WL[1]="H"), the cell currents are improved to enable high-speed operation and the write stability is also increased to enable realization of a high QoB.

Figure 13:
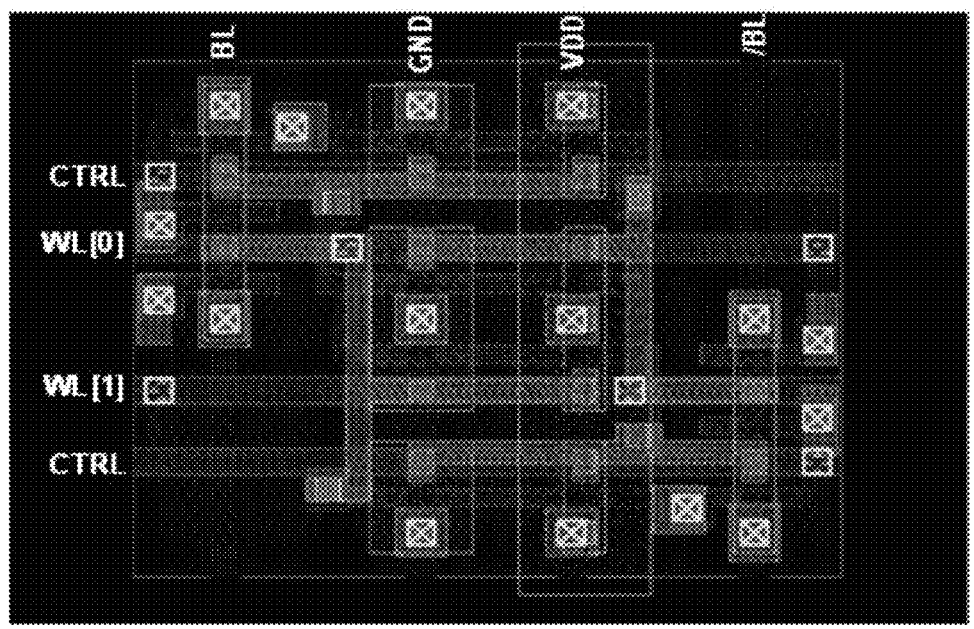
FIG. 13 is a layout diagram of memory cells in a 1-bit region of Embodiment 2.

FIG. 13 is a layout diagram of the memory cells in the 1-bit region of Embodiment 2. The area overhead in comparison to the layout area of the memory cells used in the conventional SRAM is 30%.

Here, the QoB of the 1-bit/2-cell mode is evaluated using the bit error rate (BER) obtained by stability simulation of dynamic cells made by 90 nm process technology. In the simulation, the simulation waveforms in the read/write operations shown in FIG. 11 are used as in Embodiment 1.

Figure 14:
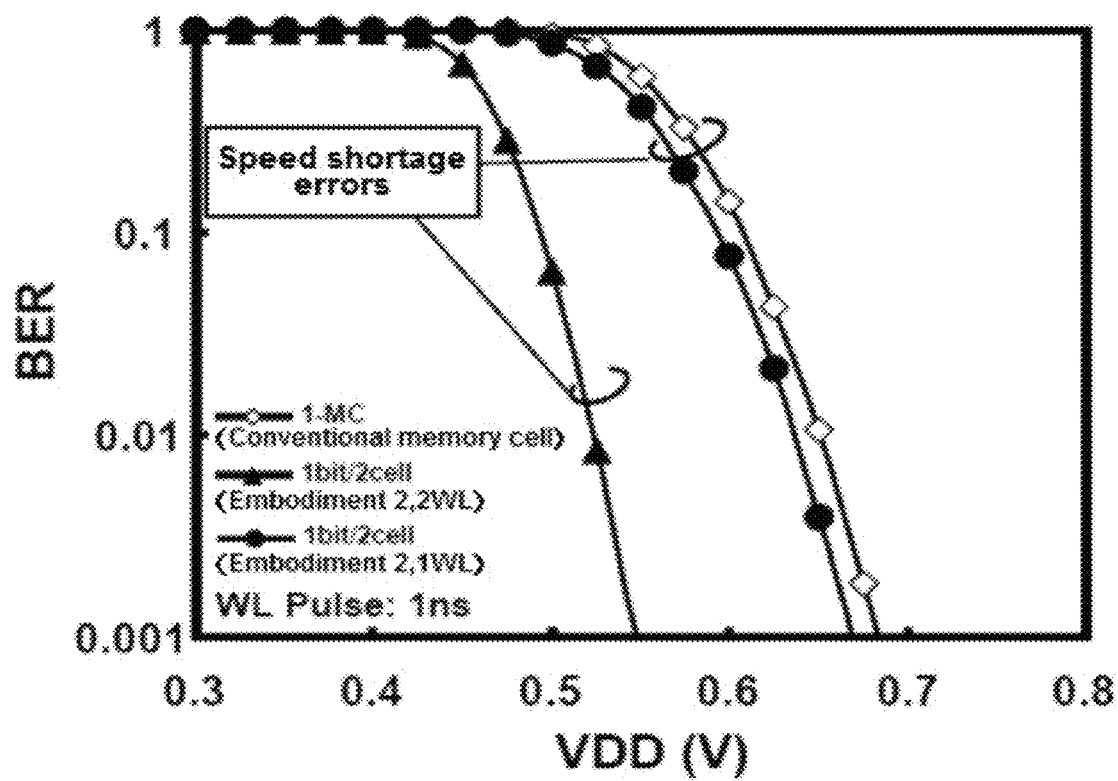
FIG. 14 is a graph of simulation results comparing BERs in read operations in memory cells in the 1-bit/2-cell mode in Embodiment 2 and memory cells in the conventional SRAM (in cases of performing the read operations at high speed).
Figure 15:
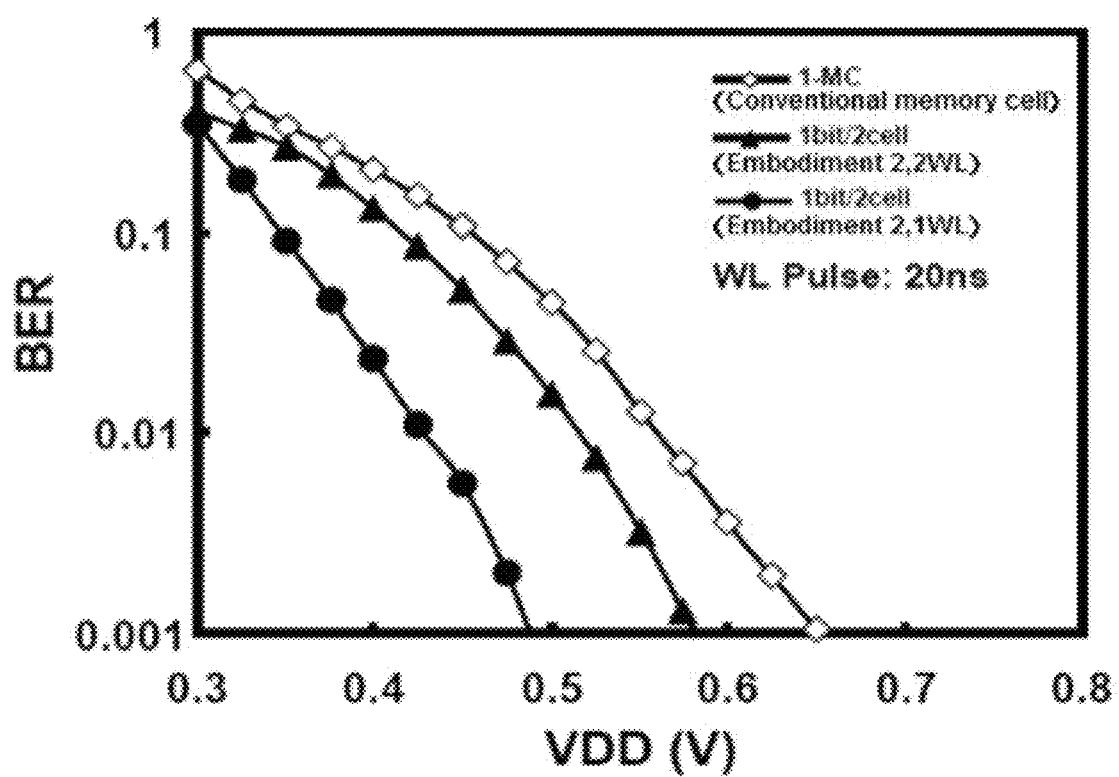
FIG. 15 is a graph of simulation results comparing BERs in read operations in memory cells in the 1-bit/2-cell mode in Embodiment 2 and memory cells in the conventional SRAM (in cases of performing the read operations at low speed).

The graphs of FIG. 14 and FIG. 15 show simulation results comparing BERs in read operations in memory cells in the 1-bit/2-cell mode in Embodiment 2 and memory cells in the conventional SRAM. The graph of FIG. 14 shows the results of performing the read operations at high speed, or to be more specific, in cases where the pulse width in the word line (WL) is 1 ns. The graph of FIG. 15 shows the results of performing the read operations at low speed, or to be more specific, in cases where the pulse width in the word line (WL) is 20 ns.

Figure 16:
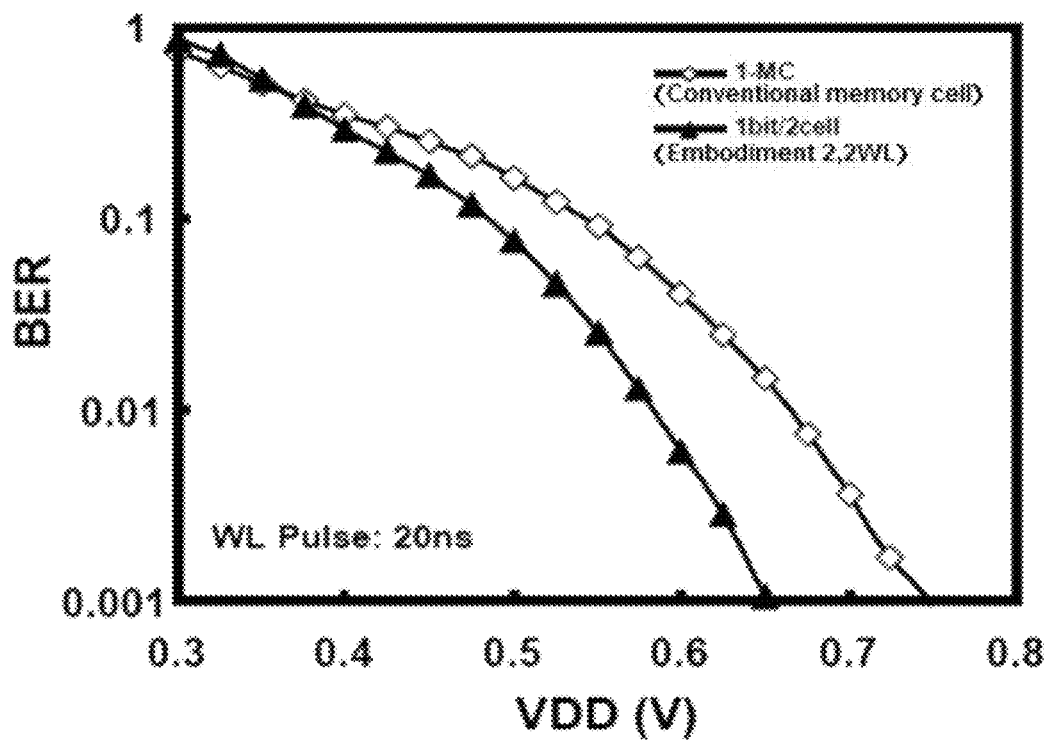
FIG. 16 is a graph of simulation results comparing BERs in write operations in memory cells in the 1-bit/2-cell mode in Embodiment 2 and memory cells in the conventional SRAM.

The graph of FIG. 16 shows simulation results comparing BERs in write operations in memory cells in the 1-bit/2-cell mode in Embodiment 2 and memory cells in the conventional SRAM. The pulse width the word line (WL) is 20 ns.

The graph of FIG. 14 (comparison of high-speed operations) shows that with the memory cells of the 1-bit/2-cell mode in Embodiment 2, the read stability is enhanced in comparison to the memory cells of the conventional 1-bit/2-cell mode, and that the read stability in high-speed operation is increased further by raising the levels of two word lines (WL). Specifically, the graph of FIG. 14 shows that the voltage at which the BER is $10^{-3}$ is improved by 120 mV in comparison to the conventional memory cells. It can thus be understood that data destruction errors can be prevented by the added transistors and that lower voltage operation is enabled in comparison to Embodiment 1.

Also, the graph of FIG. 15 (comparison of low-speed operations) shows that with the memory cells of the 1-bit/2-cell mode in Embodiment 2, the read stability is enhanced in comparison to the memory cells of the conventional 1-bit/2-cell mode, and in particular, the operating margin is improved, improvement of BER is seen in low voltage operation, and the read stability during low-speed operation is enhanced further when the level of just one of the word lines (WL) is raised. Specifically, the graph of FIG. 15 shows that the voltage at which the BER is $10^{-3}$ is improved by 160 mV in comparison to the conventional memory cells by raising the level of just one WL.

Also, the graph of FIG. 16 (comparison of write operations) shows that with the memory cells of the 1-bit/2-cell mode in Embodiment 2, the write stability is improved in comparison to the memory cells of the conventional 1-bit/2-cell mode.

From the above, it can be understood that the memory cells in the 1-bit/2-cell mode in Embodiment 2 are enhanced in read/write operation stability, can realize a high QoB, and are advantageous in comparison to the drive method of the conventional memory cells (1-bit/1-cell mode).

Also, in the case of reading by high-speed operation, the read operation stability is enhanced further and a higher QoB can be realized by accessing the memory cells by raising the levels of two word lines. Also, in the case of reading by low-speed operation, the operating margin is improved, the read operation stability during low voltage operation is enhanced, and a higher QoB can be realized by accessing the memory cells by raising the level of one word line.

Here, using the memory cells of Embodiment 2 as an example, peripheral circuits of the memory cells according to the present invention shall be described with reference to FIG. 17 to FIG. 20.

Figure 17:
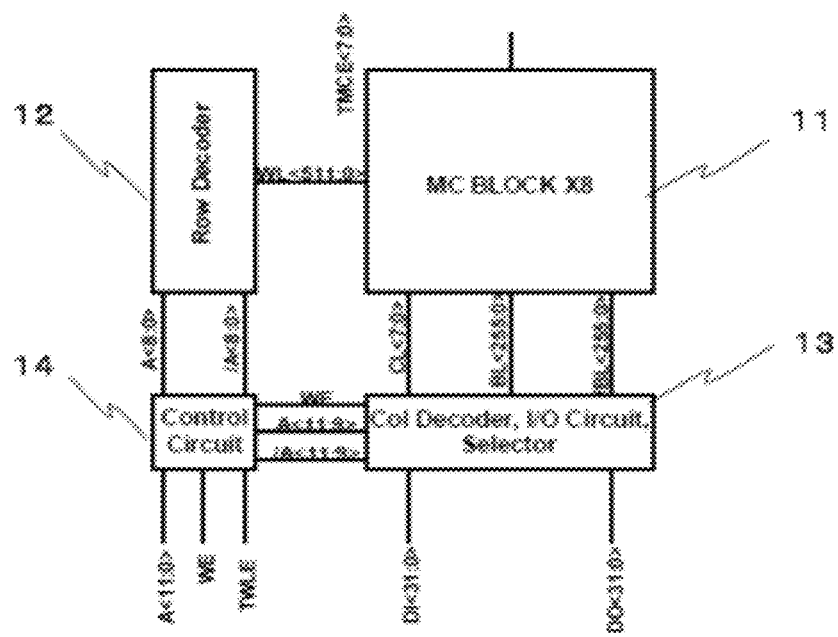
FIG. 17 is a circuit block diagram of a 128 kbit SRAM (512 rows×8 columns×32 bits/word) that uses the memory cells of Embodiment 2.

FIG. 17 is a circuit block diagram of a 128 kbit SRAM (512 rows×8 columns×32 bits/word) that uses the memory cells of Embodiment 1 and is arranged from eight memory cell blocks, a row decoder, a column decoder, an I/O circuit, a selector, and a control circuit as shown in the figure. In FIG. 17, A<11:0> is an address input, WE (write enable) is a write enable signal (write when "H"), TWLE is a signal permitting the raising of the levels of two word lines (the levels of the two word lines are raised when this signal is "H"), CTRL is a signal for switching to the 1-bit/2-cell mode (switching to the 1-bit/2-cell mode is performed when this signal is "H"), DI<31:0> is a data input, and DO<31:0> is a data output.

Figure 18:
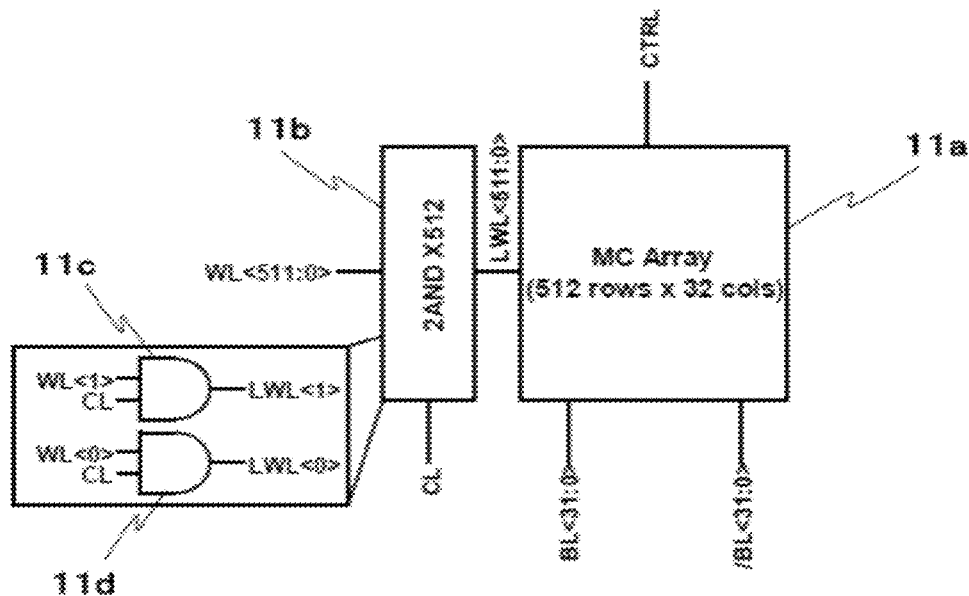
FIG. 18 is a block diagram of the memory cells of Embodiment 2.
Figure 19:
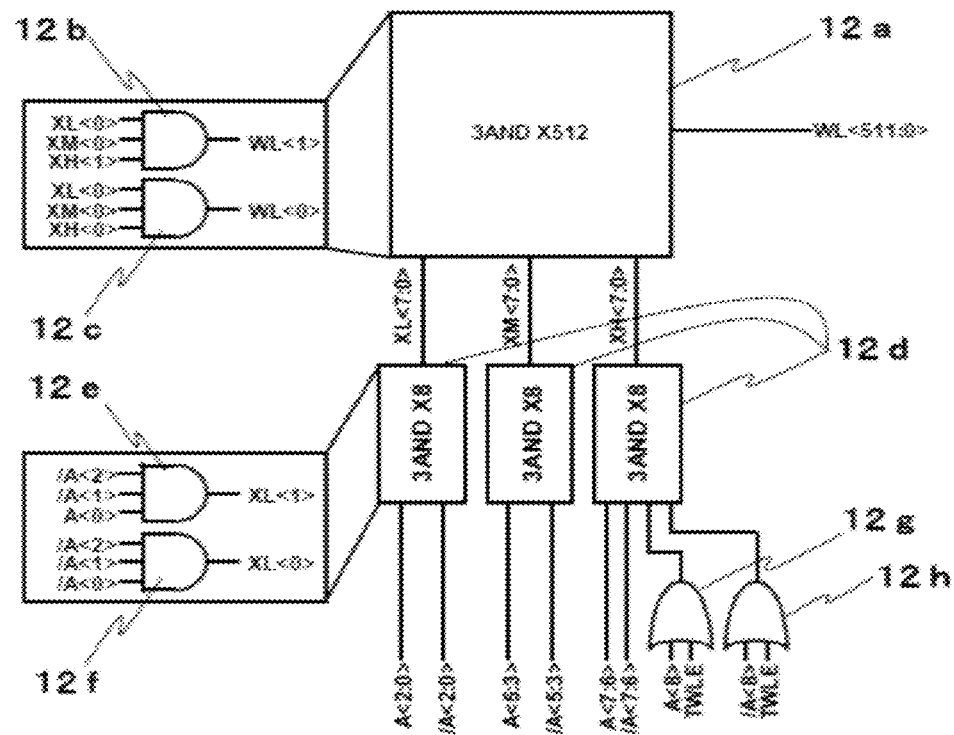
FIG. 19 is a block diagram of a row decoder circuit related to the memory cells of Embodiment 2.
Figure 20:
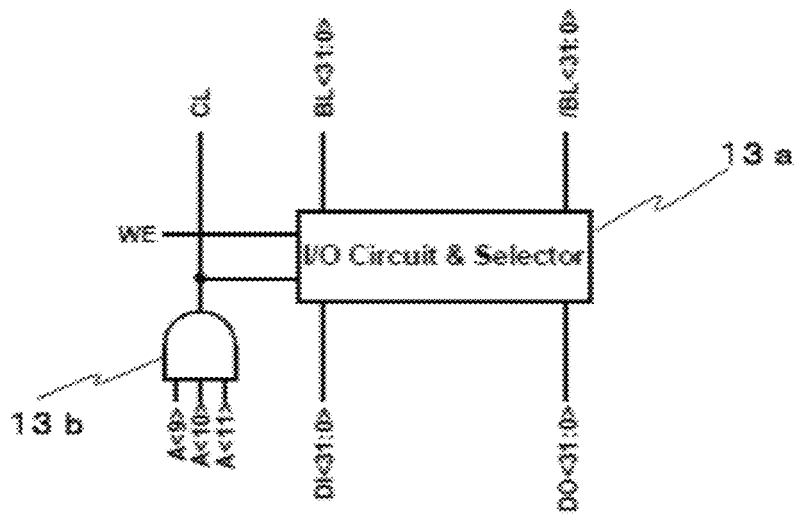
FIG. 20 is a block diagram of a column decoder and an I/O circuit related to the memory cells of Embodiment 2.

FIG. 18 is a block diagram of the memory cells of Embodiment 1. FIG. 19 is a block diagram of the row decoder circuit, which is a circuit that controls the number (one or two) of word lines (WL) that are to be raised in level. FIG. 20 is a block diagram, of the column decoder and the I/O circuit, and as the I/O circuit (sense amp, write driver, etc.), a circuit with a conventional arrangement may be used.

The row decoder, the column decoder, and the memory cell blocks that are the peripheral circuits shall now be described.

First, operations of the memory cell block shall be described with reference to FIG. 18. As shown in the memory cell block diagram of FIG. 18, when the CTRL is "H," the added transistors of the memory cells are in the conducting state and the memory cells inside the block are in the 1-bit/2-cell mode. On the other hand, when the CTRL is "L," the memory cells inside the block are in the 1-bit/1-cell mode.

Next, operations of the row decoder shall be described with reference to FIG. 19. As shown by the block diagram of the row decoder circuit of FIG. 19, row selection is performed using the address signals A<8:0> and /A<8:0> (the level of the WL becomes "H" only for the selected row). Also, the TWLE is set to "H" to raise the levels of two word lines. Also, the TWLE is set to "L" to raise the level of just one word line.

Next, operations of the column decoder shall be described with reference to FIG. 20. As shown by the block diagram of the column decoder circuit of FIG. 20, the CL becomes "H" just for the selected block, and in accordance with the AND result of the CL and the WE, the access transistor of the selected column within the selected block is made to conduct. The CL signal is generated from the address signals A<11:9> and /A<11:9>.

Embodiment 3

Next, a semiconductor memory according to Embodiment 3 is arranged from memory cells with which the reliability can be increased further in comparison to the memory cells of the semiconductor memory of Embodiment 1.

Figure 21:
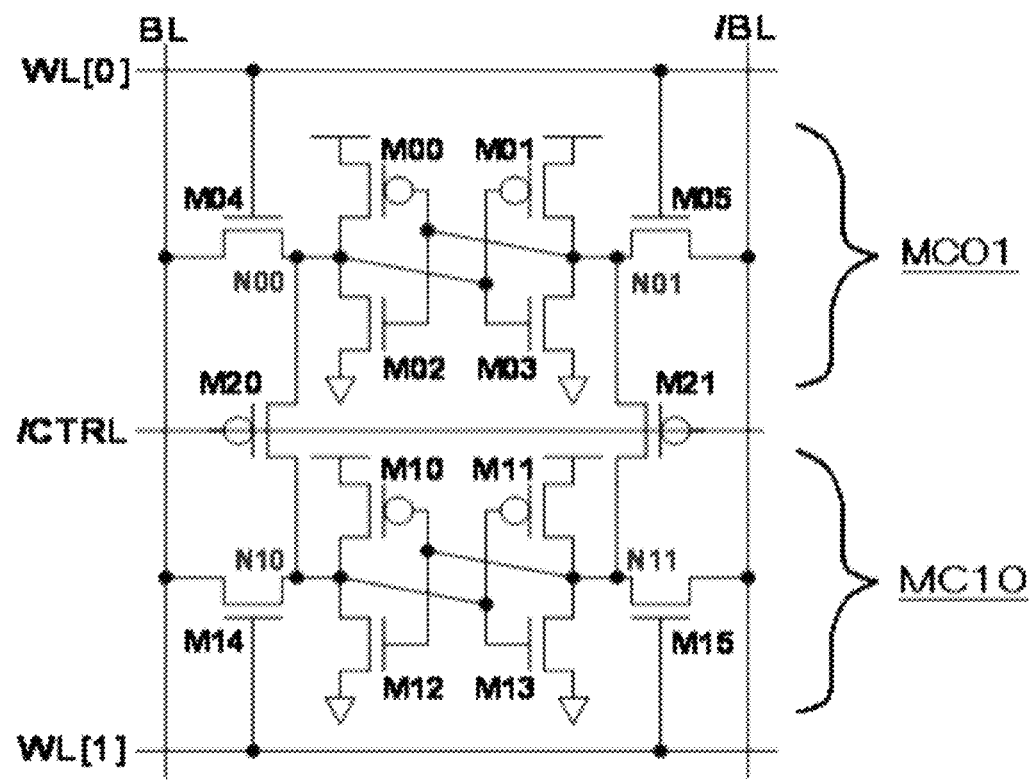
FIG. 21 is a circuit arrangement diagram of memory cells according to Embodiment 3.

FIG. 21 is a circuit arrangement diagram of the memory cells according to Embodiment 3. As shown in FIG. 21, the memory cells in the semiconductor memory of Embodiment 3 have an arrangement where a pair of P-type MOS transistors (M20 and M21) and a single control line (/CTRL) capable of controlling the P-type MOS transistors (M20 and M21) to conduct are added between the data holding nodes (between N00 and N10 and between N01 and N11) of the memory cells (MC01 and MC10) according to Embodiment 1.

With the memory cells of Embodiment 3, when the control line (/CTRL) is at the high level "H," the added pair of P-type MOS transistors (M20 and M21) are inactive and the intervals between the data holding nodes (between N00 and N10 and between N01 and N11) are in the interrupted state. When from this interrupted state, the level of one of the word lines (WL) is raised (WL[0]="H," WL[1]="L") in a read/write access process, the arrangement becomes equivalent to that of the conventional memory cells and the QoB is low as in the conventional arrangement. Also, when from the interrupted state, the levels of the two word lines (WL) are raised (WL[0]="H," WL[1]="H") in the read/write access process, the arrangement becomes equivalent to that of the memory cells of Embodiment 1 and a high QoB can be realized.

Meanwhile, with the memory cells of Embodiment 3, when the level of the control line (/CTRL) is set to the low level "L" and the added pair of P-type MOS transistors (M20 and M21) become active, the intervals between the data holding nodes (between N00 and N10 and between N01 and N11) become directly connected and variations of the memory cells during the read/write operation can be corrected. That is, if one of the memory cells is a normal memory cell, even if the other memory cell is a defective cell, the lowering of the potential of the "H" level of the defective cell can be suppressed because the added P-type MOS transistors are conducting.

Also, with the memory cells of Embodiment 3, when the level of one of the word lines (WL) rises (WL[0]="H," WL[1]="L") with the control line (/CTRL) being at the low level "L," the read stability is enhanced and a high QoB can be realized. Also, when the levels of the two word lines (WL) rise (WL[0]="H," WL[1]="H"), the cell currents are improved to enable high-speed operation and the write stability is also enhanced to enable realization of a high QoB.

Figure 22:
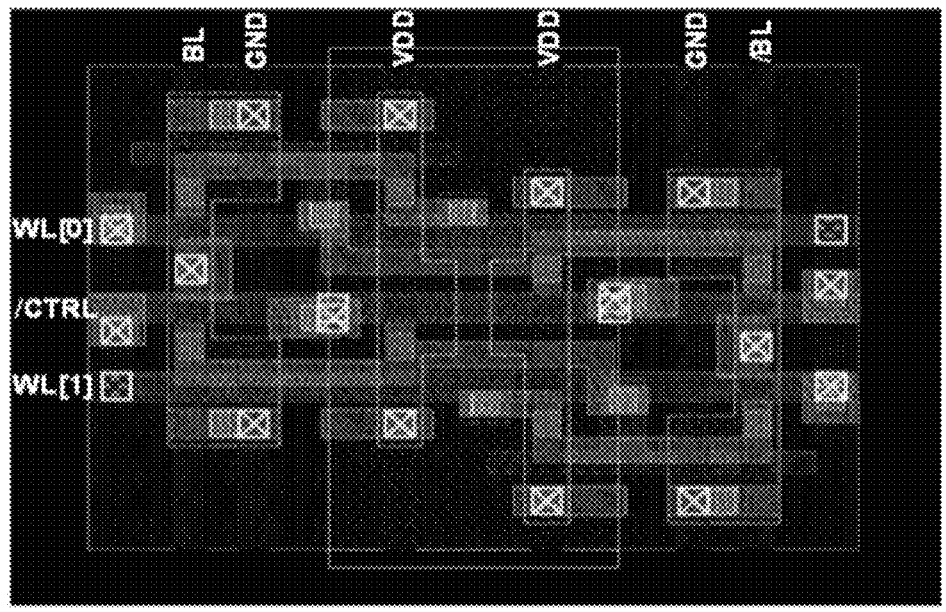
FIG. 22 is a layout diagram of memory cells in a 1-bit region of Embodiment 3.

FIG. 22 is a layout diagram of the memory cells in the 1-bit region of Embodiment 3. The area overhead in comparison to the layout area of the memory cells used in the conventional SRAM is 12%.

Here, the QoB of the 1-bit/2-cell mode is evaluated using the bit error rate (BER) obtained by stability simulation of dynamic cells made by 90 nm process technology. For the simulation, the simulation waveforms in the read/write operations shown in FIG. 11 are used as in Embodiment 1.

Figure 23:
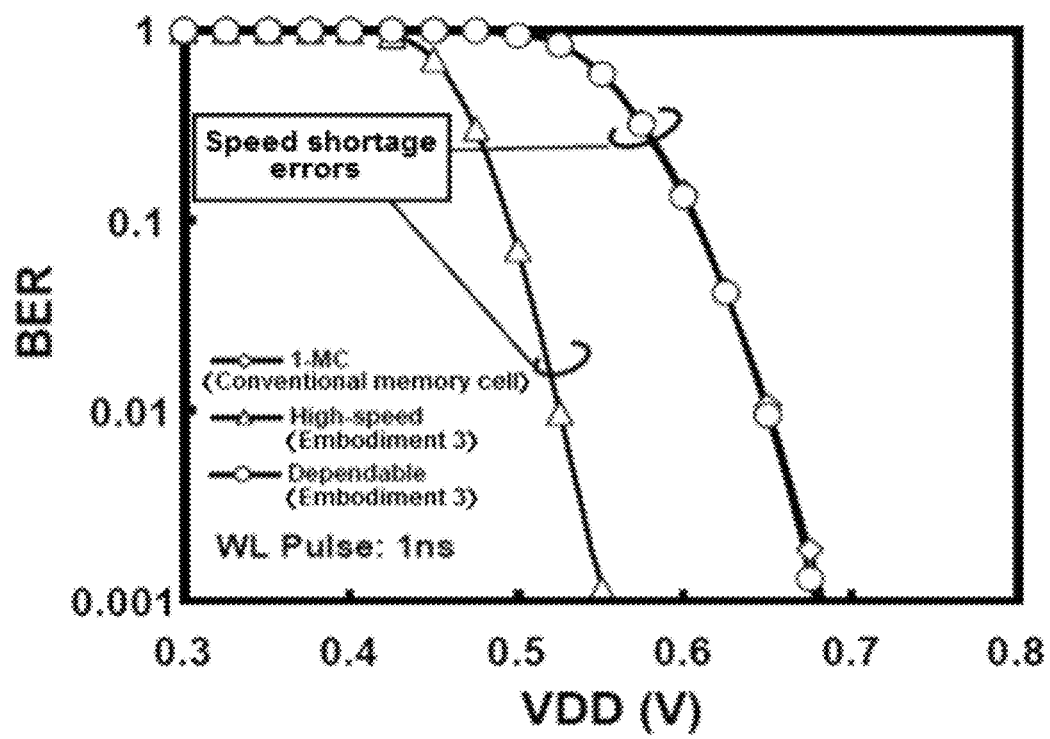
FIG. 23 is a graph of simulation results comparing BERs in read operations in memory cells in the 1-bit/2-cell mode in Embodiment 3 and memory cells in the conventional SRAM (in cases of performing the read operations at high speed).
Figure 24:
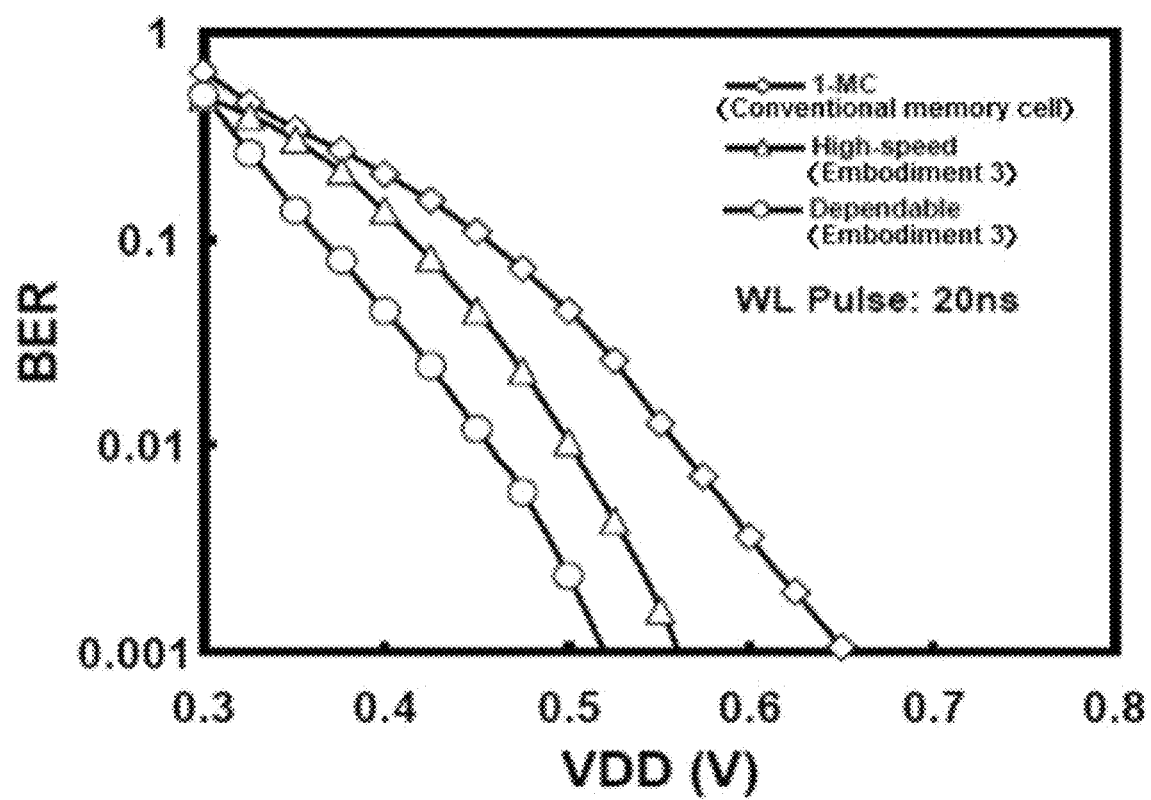
FIG. 24 is a graph of simulation results comparing BERs in read operations in memory cells in the 1-bit/2-cell mode in Embodiment 3 and memory cells in the conventional SRAM (in cases of performing the read operations at low speed).

The graphs of FIG. 23 and FIG. 24 show simulation results comparing BERs in read operation's in memory cells in the 1-bit/2-cell mode in Embodiment 3 and memory cells in the conventional SRAM. The graph of FIG. 23 shows the results of performing the read operations at high speed, or to be more specific, in cases where the pulse width in the word line (WL) is 1 ns. The graph of FIG. 24 shows the results of performing the read operations at low speed, or to be more specific, in cases where the pulse width in the word line (WL) is 20 ns.

Figure 25:
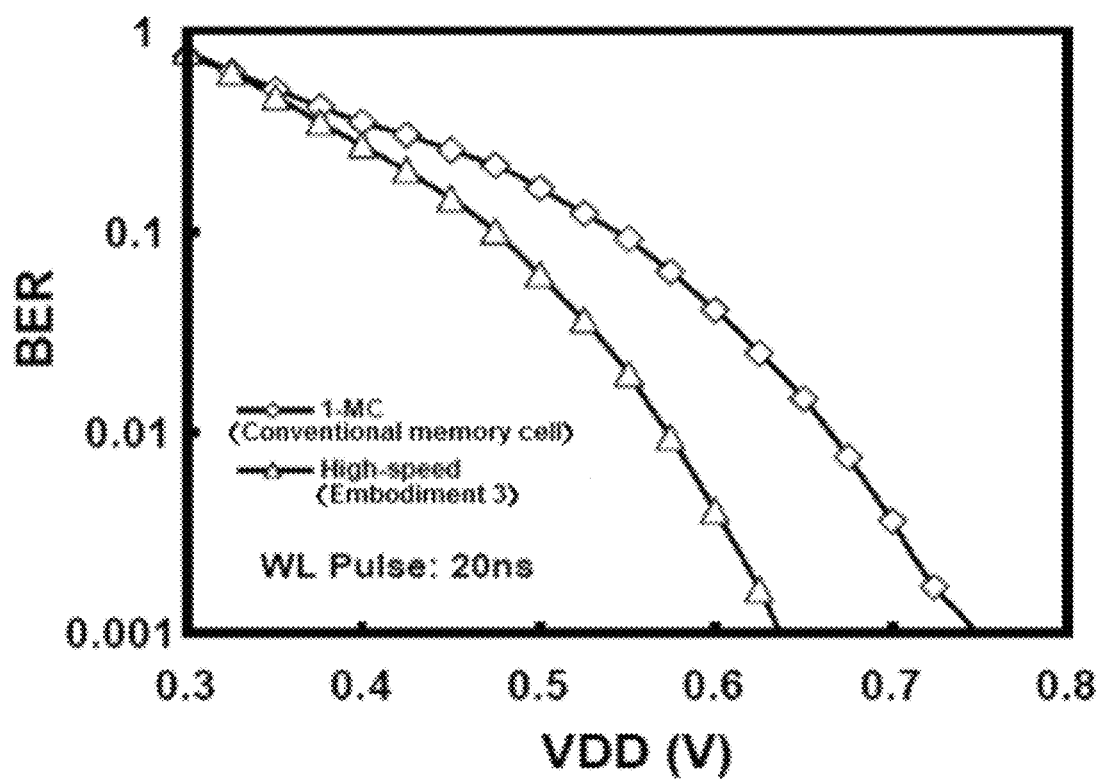
FIG. 25 is a graph of simulation results comparing BERs in write operations in memory cells in the 1-bit/2-cell mode in Embodiment 3 and memory cells in the conventional SRAM.

The graph of FIG. 25 shows simulation results comparing BERs in write operations in memory cells in the 1-bit/2-cell mode in Embodiment 3 and memory cells in the conventional SRAM. The pulse width in the word line (WL) is 20 ns.

The graph of FIG. 23 (comparison of high-speed operations) shows that with the memory cells of the 1-bit/2-cell mode in Embodiment 3, the read stability is enhanced in comparison to the memory cells of the conventional 1-bit/2-cell mode, and that the read stability in high-speed operation is enhanced further by raising the levels of two word lines (WL). Specifically, the graph of FIG. 23 shows that the voltage at which the BER is $10^{-3}$ is improved by 120 mV. It can thus be understood that data destruction errors can be prevented by the added transistors and that lower voltage operation is enabled in comparison to Embodiment 1.

Also, the graph of FIG. 24 (comparison of low-speed operations) shows that with the memory cells of the 1-bit/2-cell mode in Embodiment 3, the read stability is enhanced in comparison to the memory cells of the conventional 1-bit/2-cell mode, and in particular, the operating margin is improved, improvement of BER is seen in low voltage operation, and the read stability during low-speed operation is increased further when the level of just one of the word lines (WL) is raised. Specifically, the graph of FIG. 24 shows that the voltage at which the BER is $10^{-3}$ is improved by 130 mV in comparison to the conventional memory cells by raising the level of just one WL.

Also, the graph of FIG. 25 (comparison of write operations) shows that with the memory cells of the 1-bit/2-cell mode in Embodiment 3, the write stability is enhanced in comparison to the memory cells of the conventional 1-bit/2-cell mode.

From the above, it can be understood that the memory cells in the 1-bit/2-cell mode in Embodiment 3 are enhanced in read/write operation stability, can realize a high QoB, and are advantageous in comparison to the drive method of the conventional memory cells (1-bit/1-cell mode).

Also, in the case of reading by high-speed operation, the read operation stability is enhanced further and a higher QoB can be realized by accessing the memory cells by raising the levels of two word lines. Also, in the case of reading by low-speed operation, the operating margin is improved, the read operation stability during low-speed operation is enhanced, and a higher QoB can be realized by accessing the memory cells by raising the level of one word line.

Table 1 shown below shows guidelines for switching according to application of the respective memory cells of Embodiments 1 to 3. Although cases of the 1-bit/2-cell mode were described above, the same effects can be anticipated with a 1-bit/M-cell mode (where M is two or more).

TABLE 1

|  | Memory cells of Embodiment 1 | Memory cells of Embodiments 2 and 3 |
|---|---|---|
| High-speed operation | Raise the levels of M ($\geq 2$) WLs to access M MCs. | Raise the levels of M ($\geq 2$) WLs to access M MCs. |
| Low voltage operation | Raise the levels of M ($\geq 2$) WLs to access M MCs. | Raise the level one WL to access M ($\geq 2$) MCs. |
| Variations of process, voltage, and temperature (PVT) | Small PVT: M = 1 Large PVT: M $\geq$ 2 | Small PVT: M = 1 Large PVT: M $\geq$ 2 |
| Application | Low reliability suffices: M = 1 High reliability: M $\geq$ 2 | Low reliability suffices: M = 1 High reliability: M $\geq$ 2 |
| Memory occupancy | High occupancy: M = 1 Low occupancy: M $\geq$ 2 | High occupancy: M = 1 Low occupancy: M $\geq$ 2 |

Table 2 shown below summarizes the characteristics of the memory cells of Embodiments 1 to 3. The characteristics of the conventional SRAM memory cells are shown for comparison. In Table 2, the symbols have the following meanings: (a: poor; b: ordinary; c: good; d: excellent). Also in Table 2, "1WL" and "2WL" respectively indicate that the level of one word line is raised and the levels of two word lines are raised in the memory cells of the respective embodiments.

TABLE 2

|  | Speed during high-voltage operation | Speed during low-voltage operation | Read stability | Write stability | Area O.H. |
|---|---|---|---|---|---|
| Conventional | b | a | a | a | none |
| Embodiment 1 2WL | c | a | b (with self-correction) | a | none |
| Embodiment 2 1WL | b | b | d | — | 30% |
| Embodiment 2 2WL | c | c | b | c | 30% |
| Embodiment 3 1WL | b | b | c | — | 10% |
| Embodiment 3 2WL | c | c | b | c | 10% |

Figure 26:
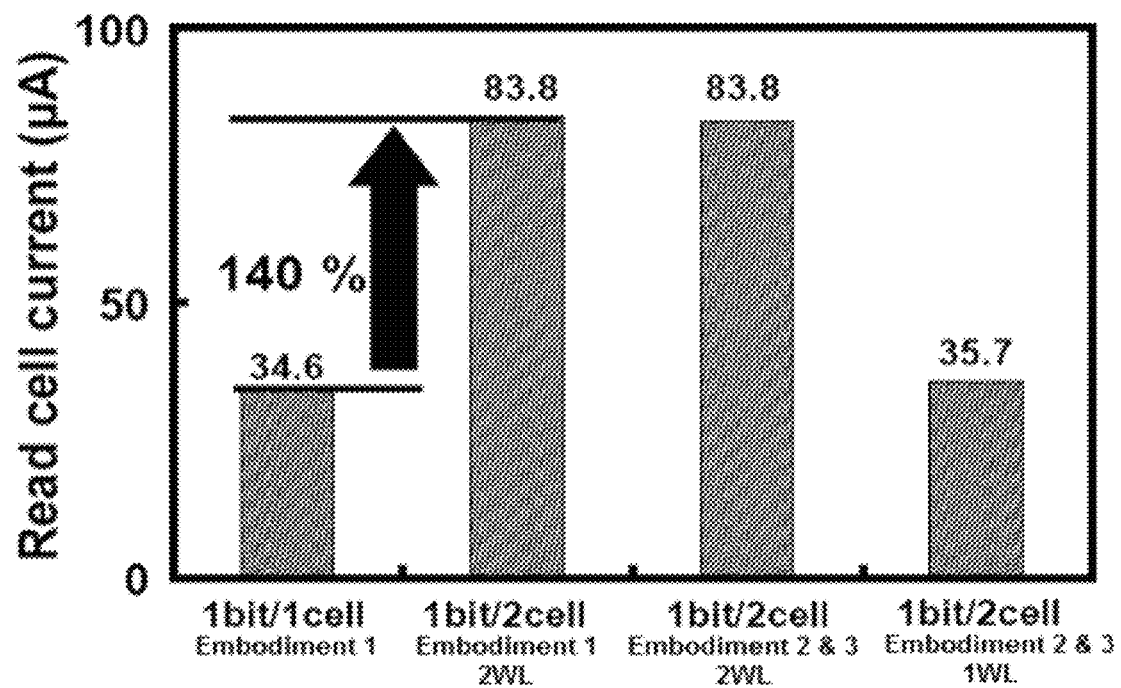
FIG. 26 is a comparison graph of read currents of the respective memory cells of Embodiments 1 to 3.

In FIG. 26, the read currents of the respective memory cells of Embodiments 1 to 3 are compared. It is shown that by raising the levels of two word lines (WL), the read current is improved by no less than two times.

Figure 27:
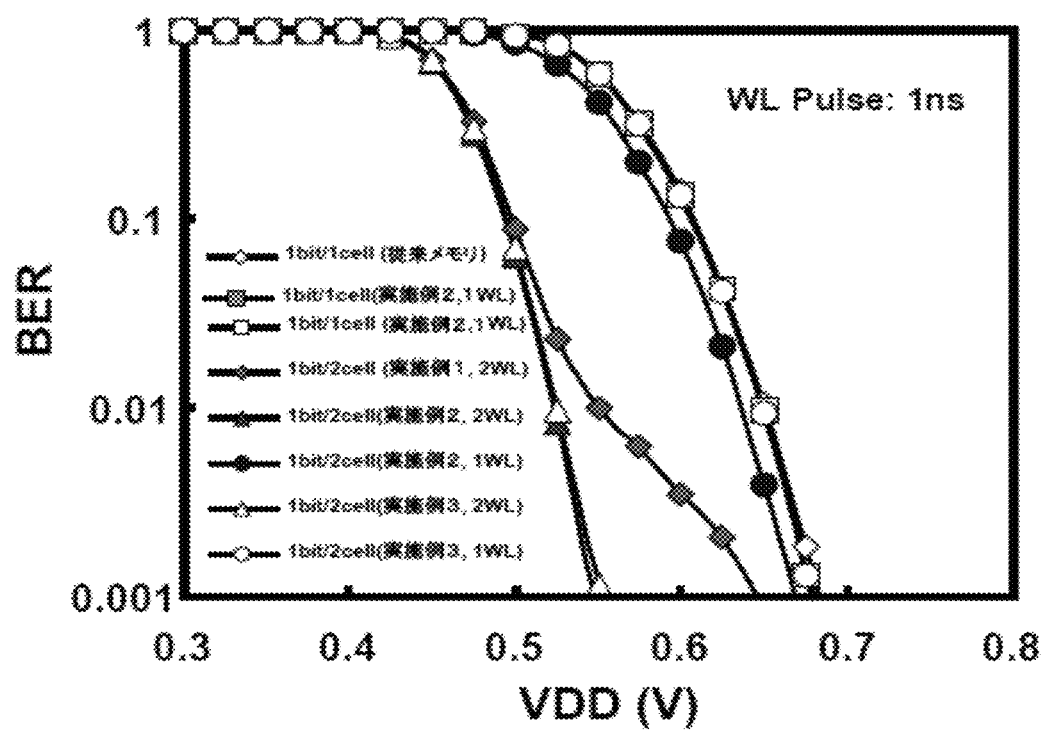
FIG. 27 is a graph of simulation results comparing BERs in read operations in memory cells in 1-bit/n-cell modes (n=1 and 2) in Embodiments 1 to 3 and memory cells in the conventional SRAM (in cases of performing the read operations at high speed).
Figure 28:
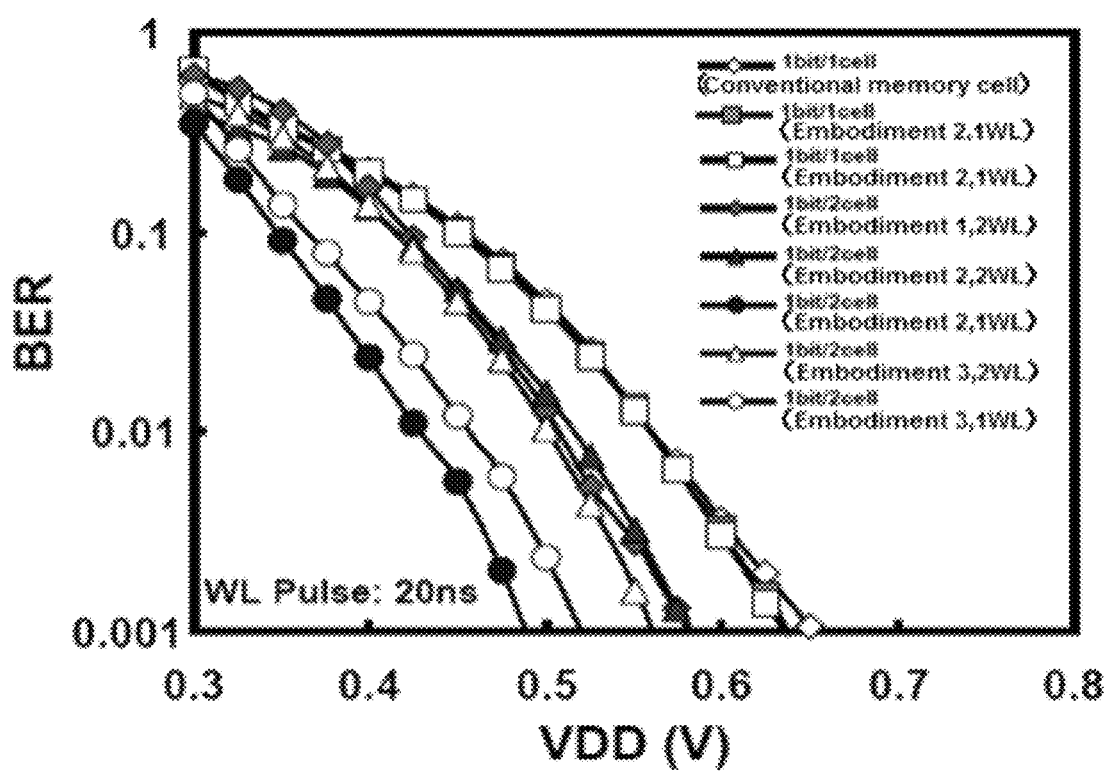
FIG. 28 is a graph of simulation results comparing BERs in read operations in memory cells in 1-bit/n-cell modes (n=1 and 2) in Embodiments 1 to 3 and memory cells in the conventional SRAM (in cases of performing the read operations at low speed).
Figure 29:
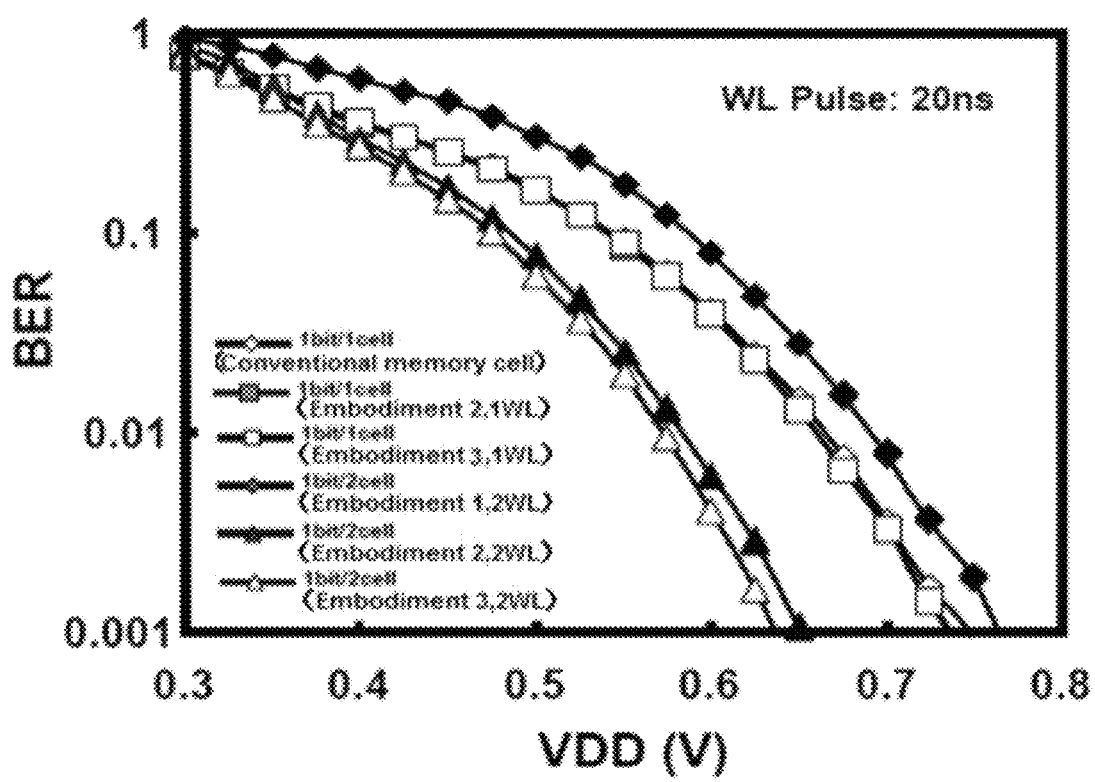
FIG. 29 is a graph of simulation results comparing BERs in write operations in memory cells in 1-bit/n-cell modes (n=1 and 2) in Embodiments 1 to 3 and memory cells in the conventional SRAM.

In relation to graphs showing the simulation results of comparison of BERs described above, graphs comparing the simulation results of memory cells in 1-bit/n-cell modes in Embodiments 1 to 3 and memory cells in the conventional SRAM are shown in FIG. 27 to FIG. 29. FIG. 27 is a graph of the simulation results comparing BERs in read operations in the memory cells in the 1-bit/n-cell modes (n=1 and 2) in Embodiments 1 to 3 and the memory cells in the conventional SRAM (in cases of performing the read operations at high speed). Also, FIG. 28 is a graph of the simulation results comparing BERs in read operations in the memory cells in the 1-bit/n-cell modes (n=1 and 2) in Embodiments 1 to 3 and the memory cells in the conventional SRAM (in cases of performing the read operations at low speed). Also, FIG. 29 is a graph of the simulation results comparing BERs in write operations in the memory cells in the 1-bit/n-cell modes (n=1 and 2) in Embodiments 1 to 3 and the memory cells in the conventional SRAM.

Embodiment 4

Figure 30:
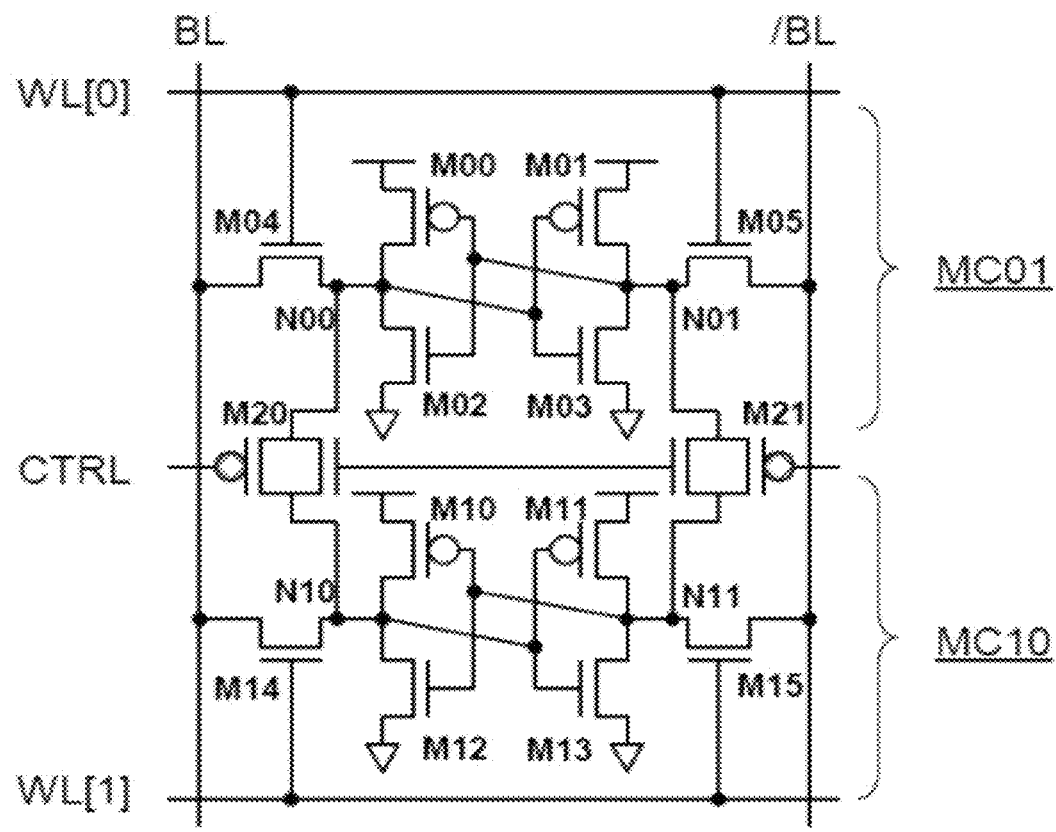
FIG. 30 is a circuit arrangement diagram of memory cells according to Embodiment 4.

As shown in the memory cell arrangement diagram of FIG. 30, memory cells in a semiconductor memory of Embodiment 4 have an arrangement where a pair of CMOS switches (M20 and M21) and a single control line (CTRL) that controls the CMOS switches (M20 and M21) are added between the data holding nodes (between N00 and N10 and between N01 and N11) of the memory cells (MC01 and MC10) according to Embodiment 1. By this arrangement, the reliability can be increased further in comparison to the memory cells of the semiconductor memory of Embodiment 1.

By addition of the pair of CMOS switches, although the area overhead is increased in comparison to Embodiments 2 and 3, variations of the transistors can be corrected better.

The operations are the same as those of Embodiment 2 and description thereof shall thus be omitted.

Embodiment 5

Figure 31:
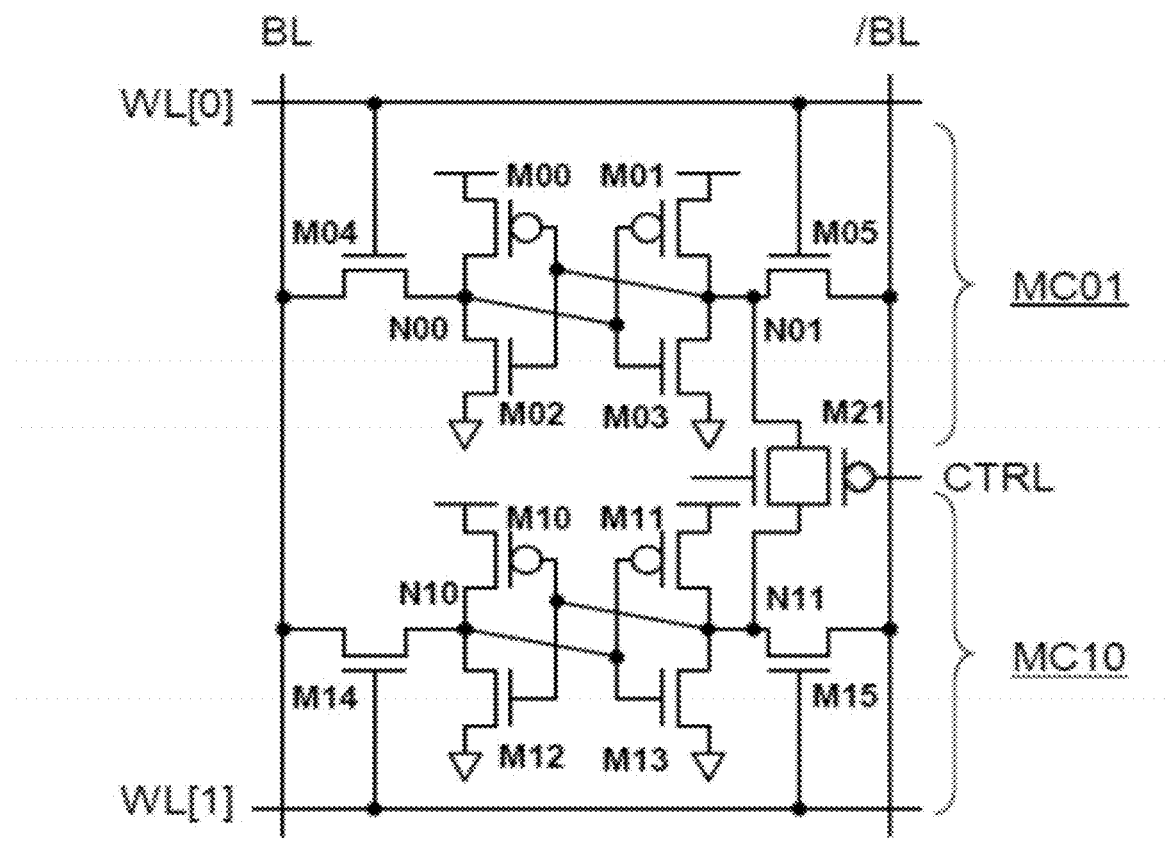
FIG. 31 is a circuit arrangement diagram of memory cells' according to Embodiment 5.

As shown in the memory cell arrangement diagram of FIG. 31, memory cells in a semiconductor memory of Embodiment 5 have an arrangement where a single CMOS switch (M21) and a single control line (CTRL) that controls the CMOS switch (M21) are added between the data holding nodes (between N00 and N10 and between N01 and N11) of the memory cells (MC01 and MC10) according to Embodiment 1. By this arrangement, the reliability can be increased further in comparison to the memory cells of the semiconductor memory of Embodiment 1.

Embodiment 6

Figure 32:
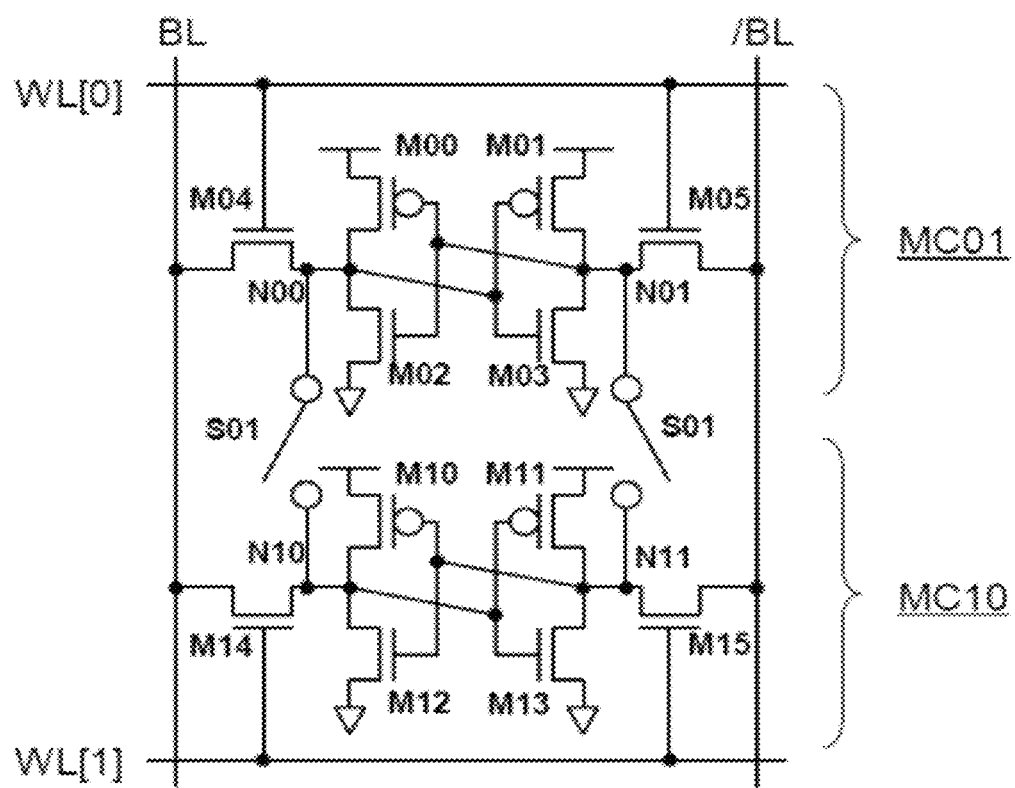
FIG. 32 is a circuit arrangement diagram of memory cells according to Embodiment 6.

As shown in the memory cell arrangement diagram of FIG. 32, memory cells in a semiconductor memory of Embodiment 6 have an arrangement where switches (S00 and S01) are added between the data holding nodes (between N00 and N10 and between N01 and N11) of the memory cells (MC01 and MC10) according to Embodiment 1. By this arrangement, the reliability can be increased further in comparison to the memory cells of the semiconductor memory of Embodiment 1.

Embodiment 7

Embodiment 7, in which the philosophy of the art of the semiconductor memory according to the present invention is applied to a DRAM, shall now be described. A DRAM is a storage element circuit in which charges are accumulated by a capacitor and a transistor and information storage is performed by means of the charges. The charges decrease with time and there is thus a need to perform rewriting (refreshing) for memory retention at every fixed time, and the stored contents are erased when a power supply of a computer is turned off. DRAMs are popularly used as main memories of computers because in comparison to the SRAM described above, the circuit is simple, the degree of integration can be increased easily, and the cost is low.

Figure 33:
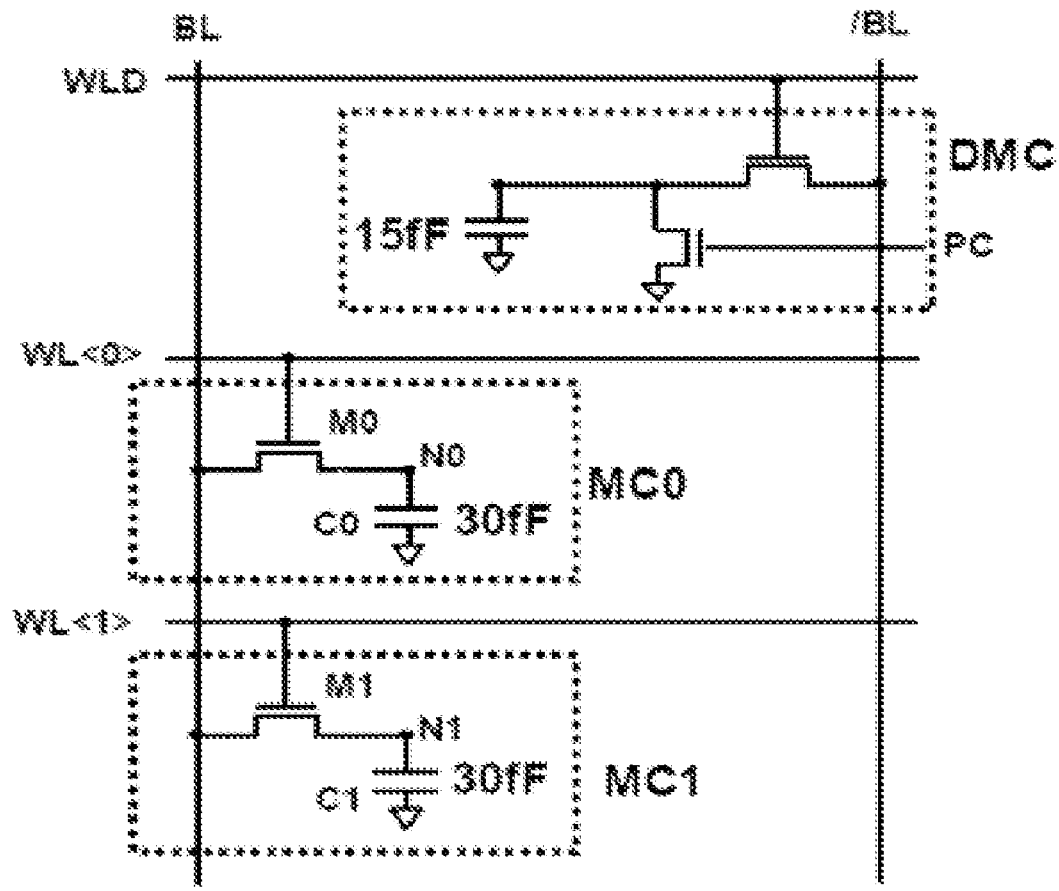
FIG. 33 is a circuit arrangement diagram of memory cells of a conventional DRAM.

FIG. 33 shows a circuit arrangement of a conventional DRAM. Memory cells (MC0 and MC1) of the DRAM are each made up of the two elements of a capacitor (C0 or C1) for accumulating charges and an access transistor (M0 or M1) that controls charging and discharging of charges into and from the capacitor. The stored content, "H" or "L," corresponds to whether or not charges are present in the capacitor.

In each column, a dummy memory cell (DMC) is disposed for generating a reference potential during a read operation. The capacitance (DC) of the capacitor of the dummy memory cell (DMC) is half of that of an ordinary memory cell.

As an example of a write operation, a case where the DRAM memory cell (MC0) is selected shall now be described. First, a write data content ("H" or "L") is applied to the bit line (BL) by a write amp. Also, a high level "H" is applied to a word line (WL[0]) of the selected row, the access transistor (M0 or M1) conducts, the level at the data hold node (N0 or N1) changes to the potential ("H" or "L") of the write data content, and the charges in the capacitor (C0) change.

Meanwhile, in a read operation, before raising the level of the word line of the selected row, the levels of the bit lines (BL and /BL) are raised to the high level "H" in advance by a pre-charging circuit (not shown) in the same manner as in the operation of the SRAM. Charging of the wiring capacitance (CBL) is thereby performed in the bit lines (BL and /BL), and the high level "H" is held even after completion of the pre-charging period. Also, by applying the high level "H" as a PC signal during the pre-charging period, a state where charges are not held in the capacitor of the dummy memory cell is attained.

After completion of the pre-charging period, the word line (WL[0]) and a dummy word line (DWL) are made to transition from the low level "L" to the high level "H" to perform the read operation.

Redistribution of the charges of the capacitor (C0) and the charges of the bit line is performed, and the potential of the bit line (BL) changes in accordance with the value of the held data content.

The potential difference of the bit lines is then detected by a sense amp, to which the bit lines (BL and /BL) are connected as differential inputs, and the stored content of the memory cell (MC0) is read out to the exterior.

Figure 34:
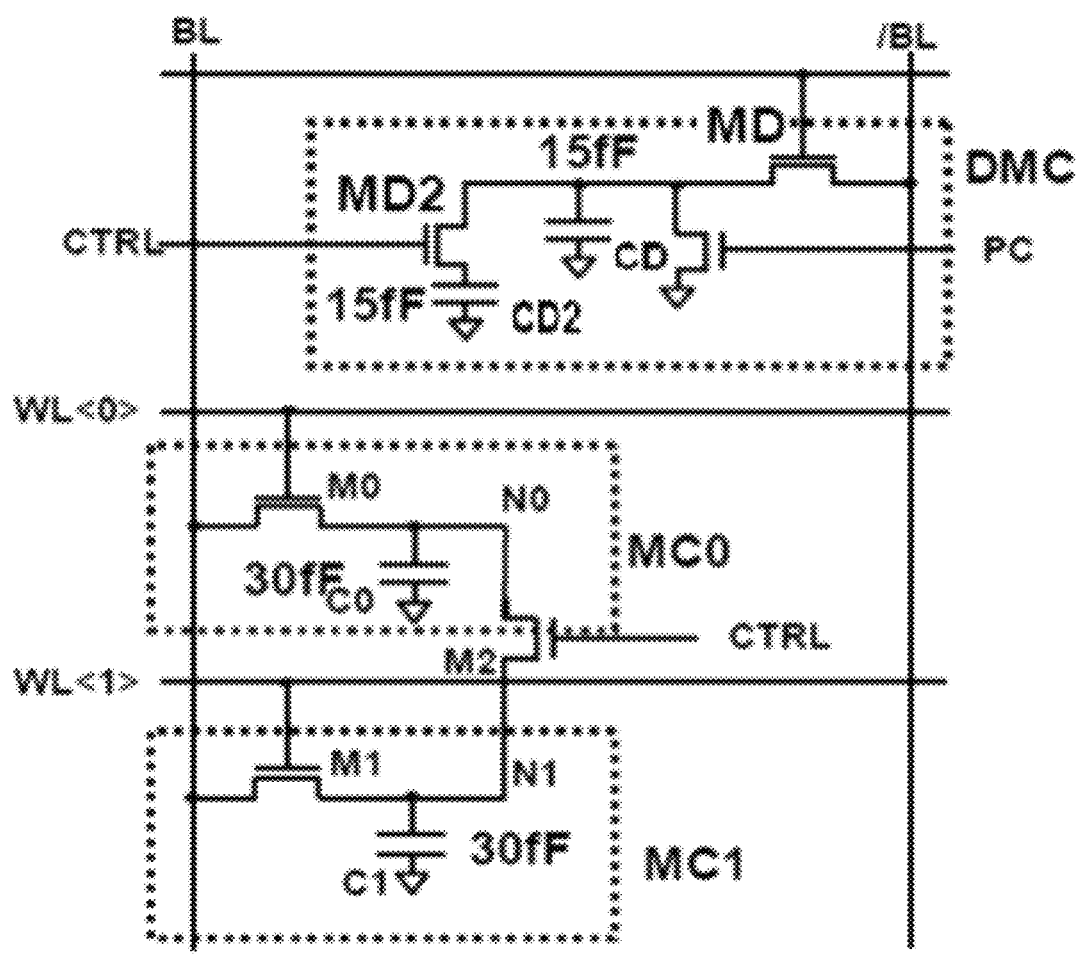
FIG. 34 is a circuit arrangement diagram of memory cells according to Embodiment 7.

FIG. 34 is a circuit arrangement diagram of the memory cells according to Embodiment 7. As shown in FIG. 34, the memory cells of Embodiment 7 have an arrangement where an N-type MOS transistor (M2) and a single control line (CTRL) capable of controlling the N-type MOS transistor (M2) to conduct are added between holding nodes N0 and N1 in a manner similar to Embodiment 2.

The dummy memory cell has an arrangement where a capacitor (CD2) is addedandan N-type MOS transistor (MD2) is added between the capacitors CD and CD2. The N-type MOS transistor (MD2) is controlled by a control line (CTRL).

Figure 35:
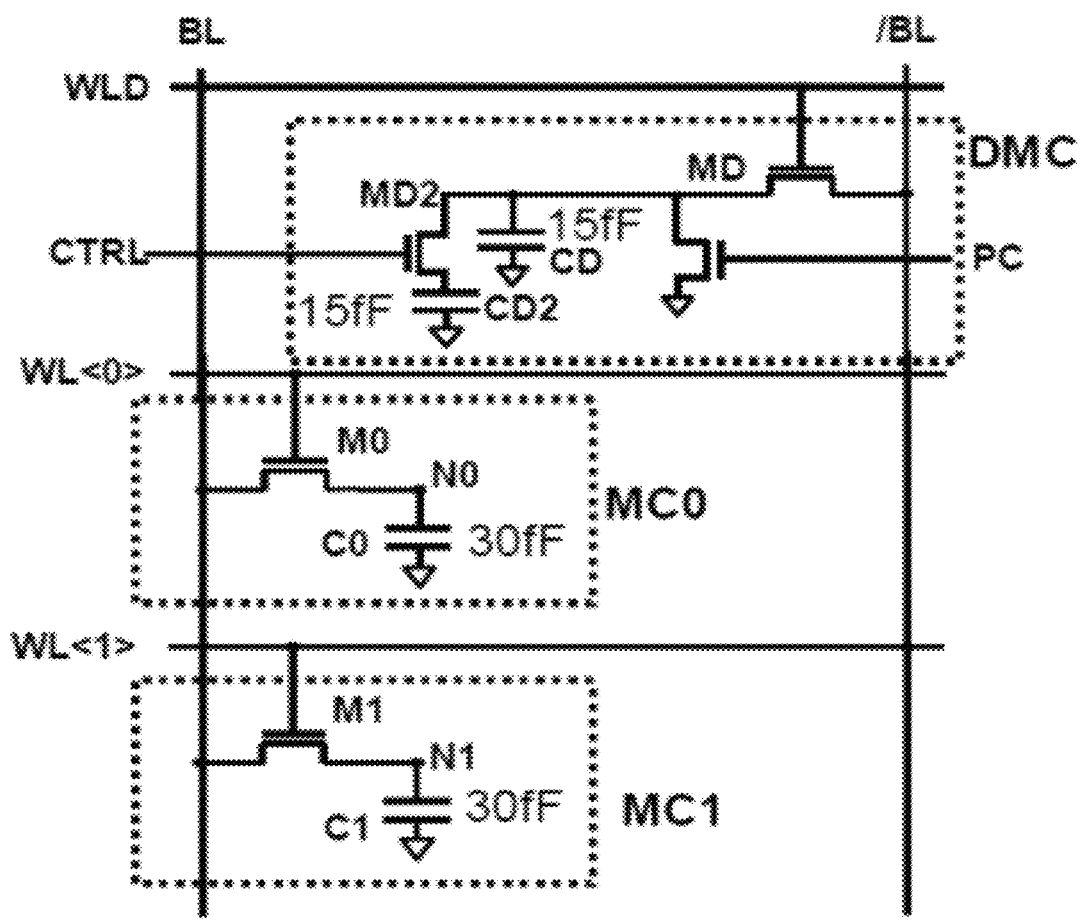
FIG. 35 is a circuit arrangement diagram of memory cells according to Embodiment 7 (with only dummy memory cells being changed).
Figure 36:
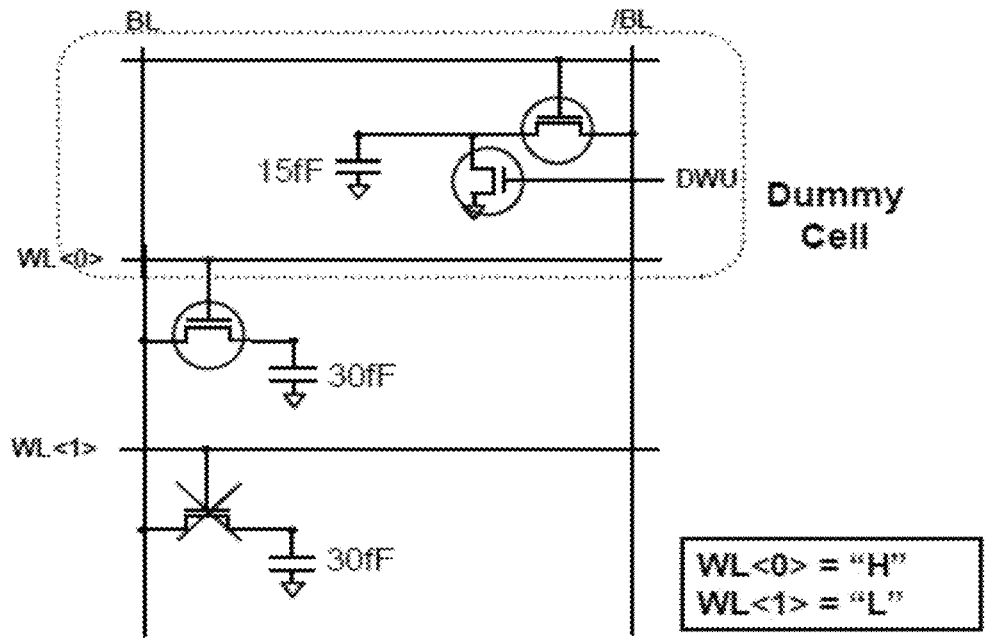
FIG. 36 is an operation explanation diagram of memory cells of the conventional DRAM (1-bit/1-cell mode).

As shown in FIG. 35, an arrangement is also possible in which just the capacitor (CD2) and the N-type MOS transistor (MD2) are added to the dummy memory cell and the same memory cells as those of the conventional arrangement are used.

Figure 37:
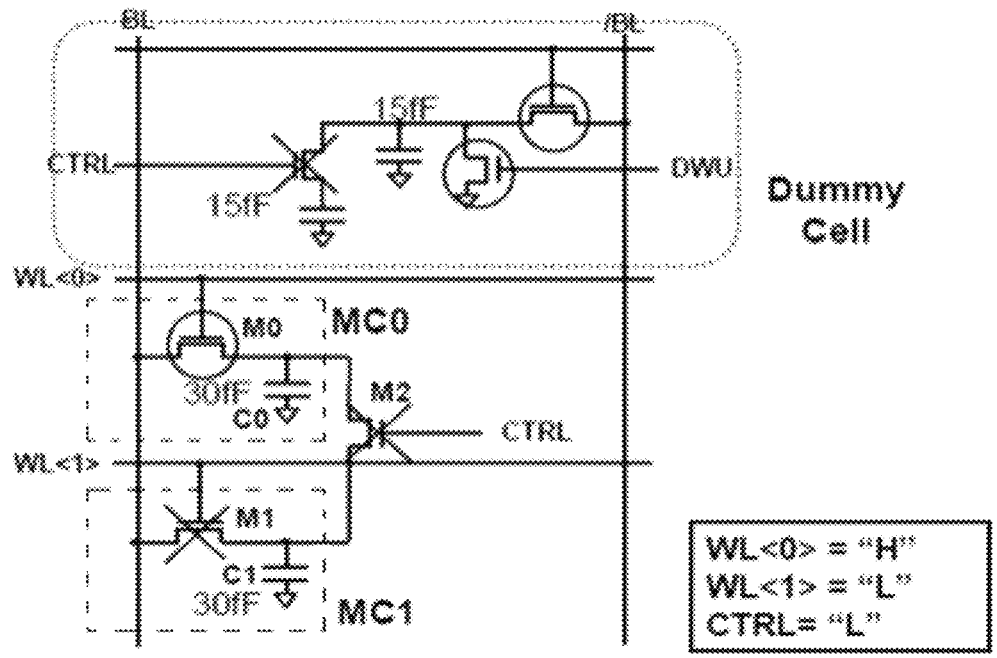
FIG. 37 is an operation explanation diagram of memory cells of Embodiment 7 (1-bit/1-cell mode).

With the memory cells of Embodiment 7, when the control line (CTRL) is at the low level "L," the added N-type MOS transistor (M2) is inactive and the interval between the data holding nodes (N0 and N1) is in an interrupted state. As shown in FIG. 37, when from the state where the control line (CTRL) is at the low level "L" (interrupted state), the level of one of the word lines (WL) is raised (WL[0]="H," WL[1]="L") in a read/write access process, the arrangement becomes equivalent to that of the conventional memory cells and the QoB is low as in the conventional arrangement.

This arrangement is the arrangement of the 1-bit/1-cell mode of the memory cells of Embodiment 7.

Figure 38:
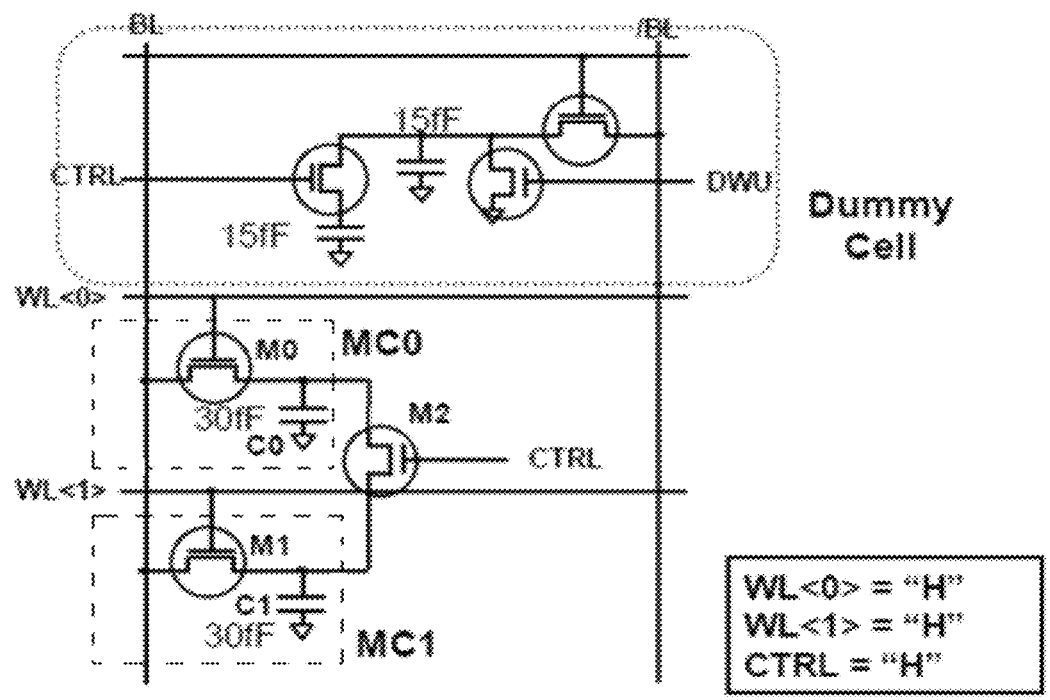
FIG. 38 is an operation explanation diagram of memory cells of Embodiment 7 (1-bit/2-cell mode, with levels of two word lines being raised).

On the other hand, with the Memory cells of Embodiment 7, in the reading access process from the state where the control line (CTRL) is at the high level "H," the levels of the two word lines (WL<0> and WL<1>) are raised to actuate the two N-type MOS transistors (M0 and M1) and access the two memory cells (MC0 and MC1) simultaneously as shown in FIG. 38. Reading of data from the two capacitors (C0 and C1) is thereby performed, and variations of the capacitors holding the data can be corrected.

Figure 39:
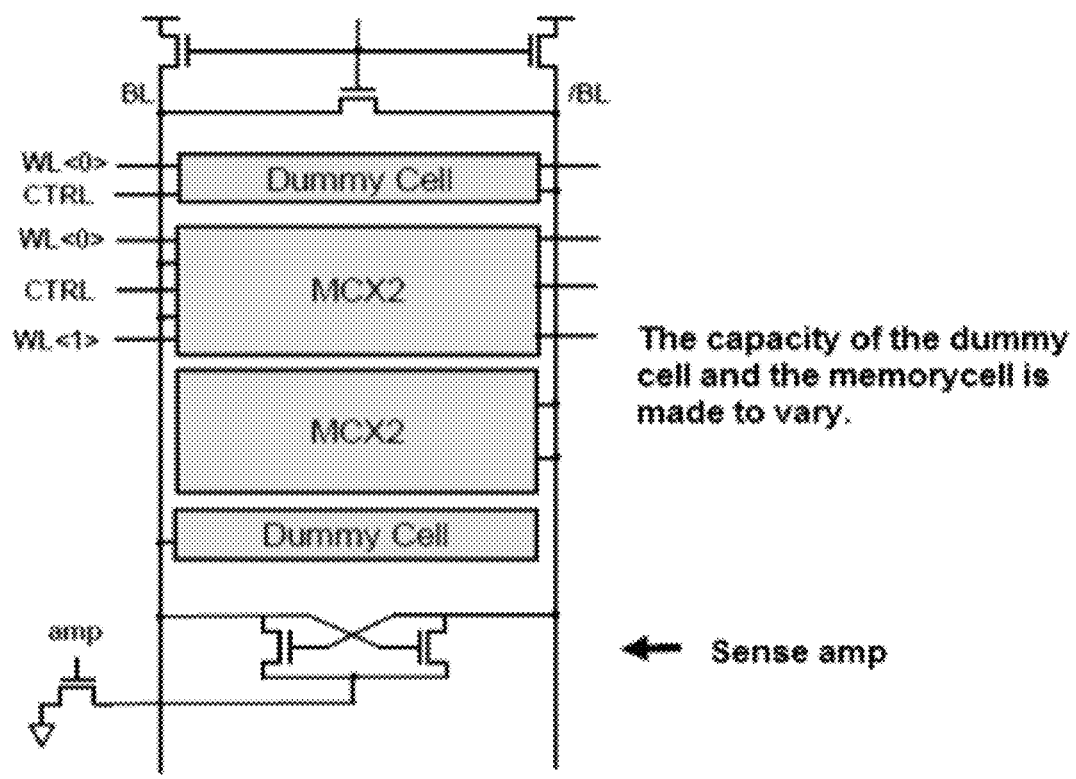
FIG. 39 is a block diagram of a simulation circuit used in Embodiment 7.

For an operation simulation of the memory cells of Embodiment 7, the circuit of the block diagram of FIG. 39 is constructed and the simulation is carried out under the following conditions:
1) Process: ASPLA (Advanced SoC Platform Corporation) 90 nm Generic Middle
2) Temperature: 125° C.
3) Capacitance: Capacitance of memory cell=30f; capacitance of dummy cell=15f×2; capacitance of BL=300f
4) Size of transistor memory cell: Access Transistor: Wa/La=0.2 microns ($\mu$)/0.1 micron ($\mu$); added transistor: Wc/Lc=0.2 microns ($\mu$)/0.1 micron ($\mu$)

Pass/fail judgments are made as follows. Evaluations and judgments are made based on the potential difference of the bit lines.
a) Reading is performed with BL="1," and BL N="0."
b) A judgment is made after an elapse of 15 ns from startup of the sense amp.
c) A "pass" judgment is made in a case where the potential difference of the bit lines is adequately amplified by the sense amp.
d) On the other hand, if the sense amp does not operate normally and the potential difference of the bit lines is insufficient, a "fail" judgment is made (the judgment is made according to whether or not the gate of the N-type MOS transistor is turned on by the BL).

Figure 40:
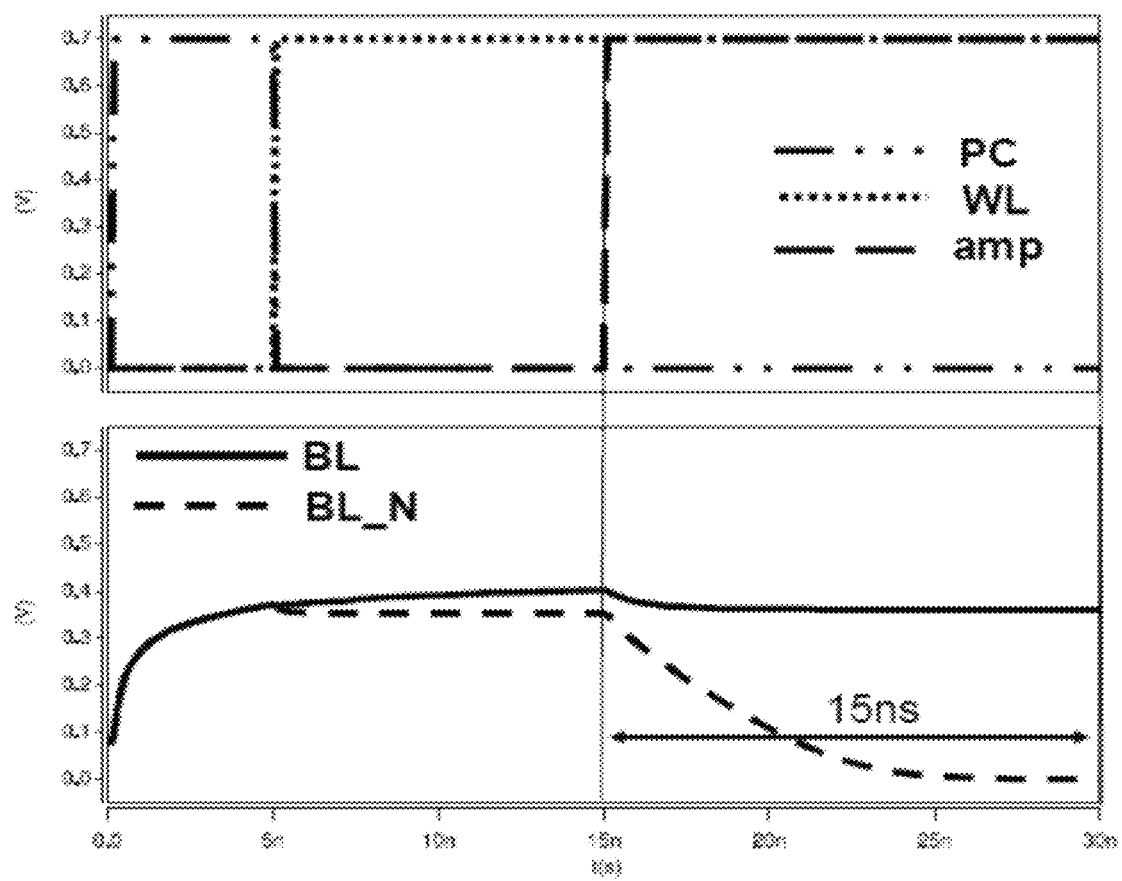
FIG. 40 is a reading waveform of results of simulation used in Embodiment 7 (pass).
Figure 41:
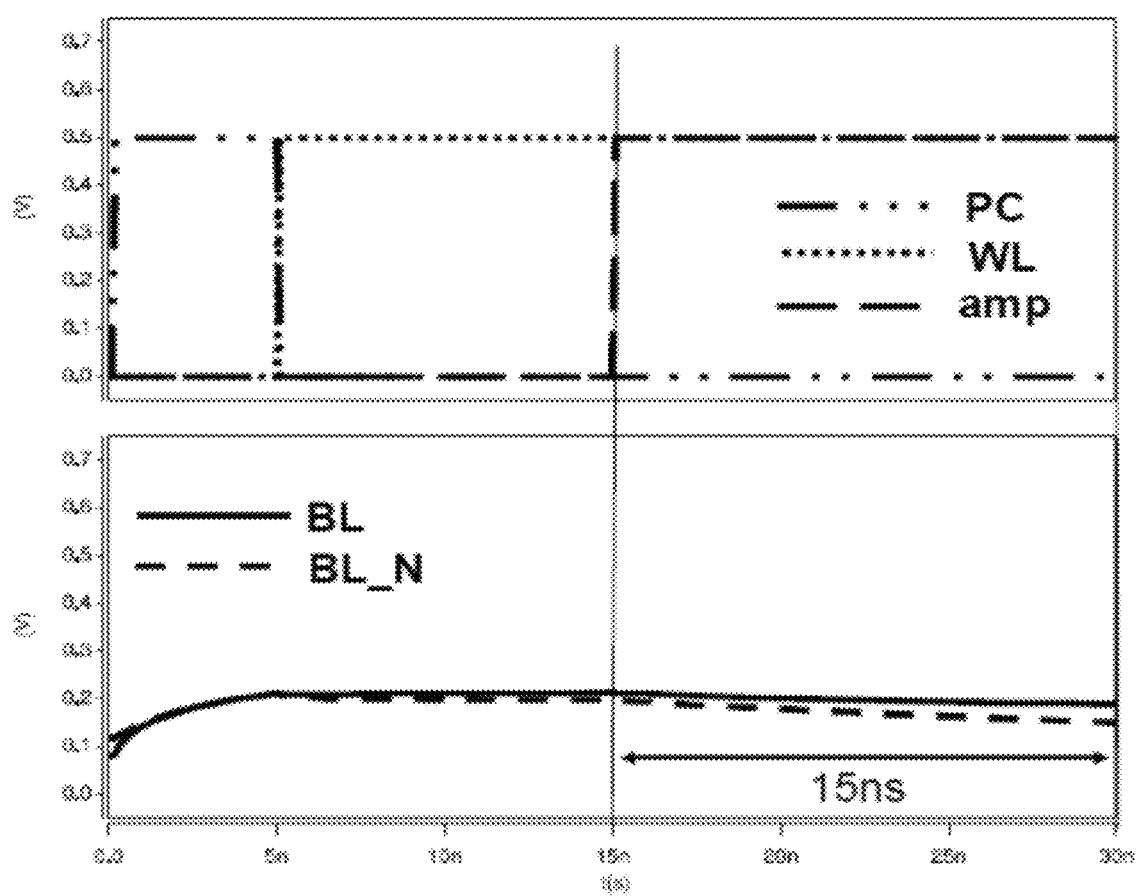
FIG. 41 is a reading waveform of results of simulation used in Embodiment 7 (fail).

FIG. 40 is a reading waveform (pass) in the operation simulation, and FIG. 41 is a reading waveform (fail) in the operation simulation. "H" is held in each of the memory cells (MC0 and MC1). First, "H" is applied as the PC signal to charge the bit lines (BL and /BL) to "H," and "L" is held in the dummy memory cell (DMC). Thereafter, "H" is applied to the WL and the amp, and the potential difference of the bit lines (BL and /BL) is amplified by the sense amp. In FIG. 40, the potential difference of the bit lines is amplified by the sense amp and the potential difference of the bit lines (BL and /BL) is sufficiently secured.

On the other hand, FIG. 41 shows a state where the potential difference of the bit lines is not amplified normally by the sense amp.

Figure 42:
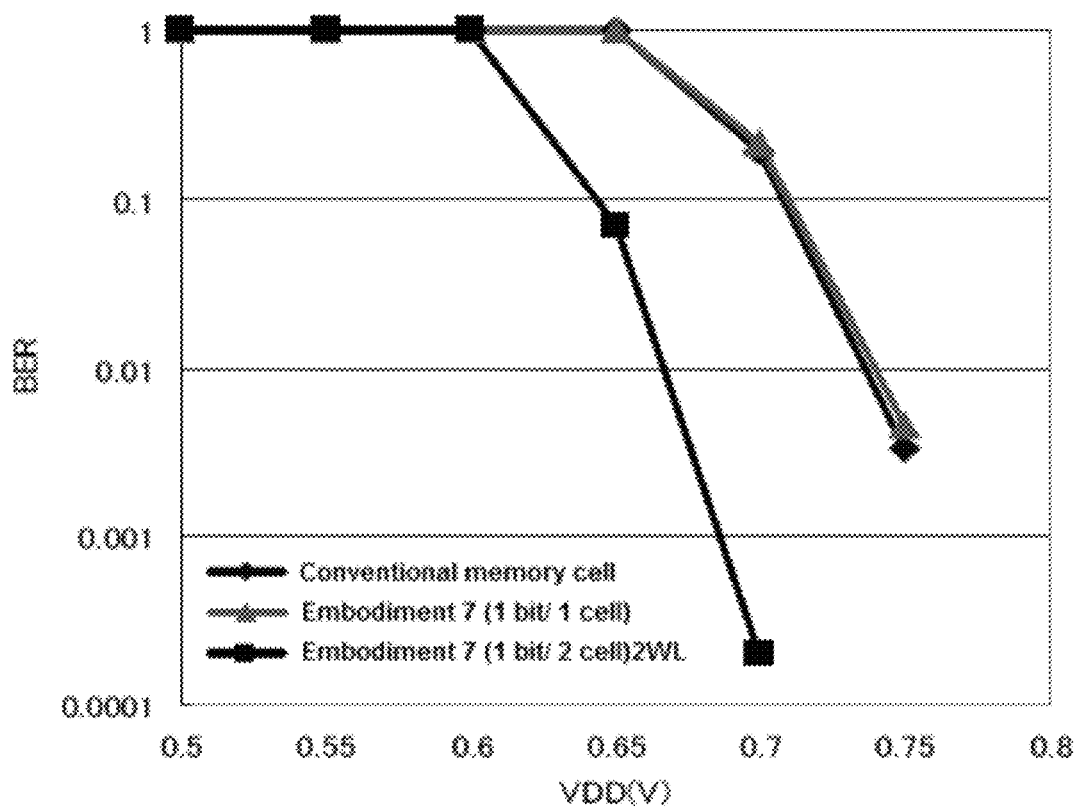
FIG. 42 is a graph of simulation results comparing BERs in respective operations in the 1-bit/1-cell mode and the 1-bit/2-cell mode and in memory cells in Embodiment 7 and memory cells in the conventional SRAM.

FIG. 42 shows the simulation results (fail bit count). It can be seen that by constructing the arrangement of the memory cells of Embodiment 7 and raising the levels of two word lines (WL), the BER can be reduced in comparison to the memory cells of the conventional DRAM. Specifically, the graph of FIG. 42 shows that the voltage at which the BER is $10^{-2}$ is improved by 80 mV.

INDUSTRIAL APPLICABILITY

The present invention is useful in an SRAM used as cache memory, etc., in a computer or in a DRAM used as a main memory, etc.

| | [Description of Symbols] |
|---|---|
| 11 | Memory cell block |
| 12 | Row decoder |
| 13 | Column decoder |
| 14 | Control circuit |

What is claimed is:

1. A semiconductor memory comprising memory cells each in turn comprising: a pair of cross-coupled coupled inverters with respective outputs connected to paths respectively leading to each of a pair of bit lines disposed in correspondence to a column of the memory cells; a pair of switch units disposed between the bit lines and the outputs of the inverters; and a single word line controllable by conduction of the switch units; and wherein dynamic switching between a mode in which one bit is allocated to one memory cell (1-bit/1-cell mode) and a mode in which one bit is allocated to n (where n is two or more) coupled memory cells (1-bit/n-cell mode) is enabled, and by switching to the 1-bit/n-cell mode, operation stability of one bit is enhanced, a cell current during a read operation is increased (the read operation is made high in speed), and self-correction of bit error is enabled.

2. The semiconductor memory according to claim 1, wherein the 1-bit/n-cell mode has an arrangement where a pair of N-type MOS transistors and a single control line capable of controlling the N-type MOS transistors to conduct are further added between data holding nodes of adjacent memory cells.

3. The semiconductor memory according to claim 1, wherein the 1-bit/n-cell mode has an arrangement where a pair of P-type MOS transistors and a single control line capable of controlling the P-type MOS transistors to conduct are further added between data holding nodes of adjacent memory cells.

4. The semiconductor memory according to claim 1, wherein the 1-bit/n-cell mode has an arrangement where a pair of CMOS switches and a single control line capable of controlling the CMOS switches to conduct are further added between data holding nodes of adjacent memory cells.

5. The semiconductor memory according to claim 1, wherein the 1-bit/n-cell mode has an arrangement where a single CMOS switch and a single control line capable of controlling the CMOS switch to conduct are further added between data holding nodes of adjacent memory cells.

6. The semiconductor memory according to claim 1, wherein the 1-bit/n-cell mode has an arrangement where a pair of switch units are further added between data holding nodes of adjacent memory cells.

7. The semiconductor memory according to claim 2, wherein in a case where n is 2 in the 1-bit/n-cell mode (1-bit/2-cell mode), only one word line among the two word lines of the two memory cells is made to transition to a high level to enable enhancement of the stability of the data read operation.

8. The semiconductor memory according to claim 2, wherein in a case where n is 2 in the 1-bit/n-cell mode (1-bit/2-cell mode), the two word lines of the two memory cells are made to transition to a high level to enable increase of the cell current during the read operation (increase of the speed of the read operation) and enhancement of the stability of the data write operation.

9. The semiconductor memory according to claim 1, wherein the switching of the mode is performed in memory block units.

10. The semiconductor memory according to claim 3, wherein in a case where n is 2 in the 1-bit/n-cell mode (1-bit/2-cell mode), only one word line among the two word lines of the two memory cells is made to transition to a high level to enable enhancement of the stability of the data read operation.

11. The semiconductor memory according to claim 4, wherein in a case where n is 2 in the 1-bit/n-cell mode (1-bit/2-cell mode), only one word line among the two word lines of the two memory cells is made to transition to a high level to enable enhancement of the stability of the data read operation.

12. The semiconductor memory according to claim 3, wherein in a case where n is 2 in the 1-bit/n-cell mode (1-bit/2-cell mode), the two word lines of the two memory cells are made to transition to a high level to enable increase of the cell current during the read operation (increase of the speed of the read operation) and enhancement of the stability of the data write operation.

13. The semiconductor memory according to claim 4, wherein in a case where n is 2 in the 1-bit/n-cell mode (1-bit/2-cell mode), the two word lines of the two memory cells are made to transition to a high level to enable increase of the cell current during the read operation (increase of the speed of the read operation) and enhancement of the stability of the data write operation.

14. A semiconductor memory comprising memory cells each in turn comprising: a capacitor for storing charges; an access transistor controlling charging and discharging of charges into and from the capacitor; and a single word line capable of controlling the access transistor; and wherein dynamic switching between a mode in which one bit is allocated to one memory cell (1-bit/1-cell mode) and a mode in which one bit is allocated to n (where n is two or more) coupled memory cells (1-bit/n-cell mode) is enabled, and by switching to the 1-bit/n-cell mode, operation stability of one bit is enhanced, a cell current during a read operation is increased (the read operation is made high in speed), and self-correction of bit error is enabled.

15. The semiconductor memory according to claim 14, wherein the 1-bit/n-cell mode has an arrangement where a single CMOS switch and a single control line capable of controlling the CMOS switch to conduct are further added between data holding nodes of adjacent memory cells.

16. The semiconductor memory according to claim 14, wherein the 1-bit/n-cell mode has an arrangement where a single N-type MOS transistor and a single control line capable of controlling the N-type MOS transistor to conduct are further added between data holding nodes of adjacent memory cells.

17. The semiconductor memory according to claim 14, wherein the 1-bit/n-cell mode has an arrangement where a single switch unit is further added between data holding nodes of adjacent memory cells.

18. A computer comprising:

a plurality of semiconductor memory cells, each of the cells having: a pair of cross-coupled inverters with respective outputs connected to paths respectively leading to each of a pair of bit lines disposed in correspondence to a column of the memory cells; a pair of switch units disposed between the bit lines and the outputs of the inverters; and a single word line controllable by conduction of the switch units; and wherein dynamic switching between a mode in which one bit is allocated to one memory cell (1-bit/1-cell mode) and a mode in which one bit is allocated to n (where n is two or more) coupled memory cells (1-bit/n-cell mode) is enabled, and by switching to the 1-bit/n-cell mode, operation stability of one bit is enhanced, a cell current during a read operation is increased (the read operation is made high in speed), and self-correction of bit error is enabled; and a memory containing a program to execute a step of switching from the 1-bit/1-cell mode to the 1-bit/n-cell mode when a memory occupancy is no more than a predetermined threshold.

19. A computer comprising:
a plurality of semiconductor memory cells, each of the cells having: a pair of cross-coupled inverters with respective outputs connected to paths respectively leading to each of a pair of bit lines disposed in correspondence to a column of the memory cells; a pair of switch units disposed between the bit lines and the outputs of the inverters; and a single word line controllable by conduction of the switch units; and wherein dynamic switching between a mode in which one bit is allocated to one memory cell (1-bit/1-cell mode) and a mode in which one bit is allocated to n (where n is two or more) coupled memory cells (1-bit/n-cell mode) is enabled, and by switching to the 1-bit/n-cell mode, operation stability of one bit is enhanced, a cell current during a read operation is increased (the read operation is made high in speed), and self-correction of bit error is enabled; and a memory containing a program to execute a step of switching from the 1-bit/1-cell mode to the 1-bit/n-cell mode when a remaining battery amount falls to no more than a predetermined threshold.

20. A computer comprising:
a plurality of semiconductor memory cells, each of the cells having: a pair of cross-coupled inverters with respective outputs connected to paths respectively leading to each of a pair of bit lines disposed in correspondence to a column of the memory cells; a pair of switch units disposed between the bit lines and the outputs of the inverters; and a single word line controllable by conduction of the switch units; and wherein dynamic switching between a mode in which one bit is allocated to one memory cell (1-bit/1-cell mode) and a mode in which one bit is allocated to n (where n is two or more) coupled memory cells (1-bit/n-cell mode) is enabled, and by switching to the 1-bit/n-cell mode, operation stability of one bit is enhanced, a cell current during a read operation is increased (the read operation is made high in speed), and self-correction of bit error is enabled; and a memory containing a program to execute a step of switching from the 1-bit/1-cell mode to the 1-bit/n-cell mode when an operating speed or an operating voltage of the memory cells falls to no more than a predetermined threshold.

21. A computer comprising:
a plurality of semiconductor memory cells, each of the cells having: a pair of cross-coupled inverters with respective outputs connected to paths respectively leading to each of a pair of bit lines disposed in correspondence to a column of the memory cells; a pair of switch units disposed between the bit lines and the outputs of the inverters; and a single word line controllable by conduction of the switch units; and wherein dynamic switching between a mode in which one bit is allocated to one memory cell (1-bit/1-cell mode) and a mode in which one bit is allocated to n (where n is two or more) coupled memory cells (1-bit/n-cell mode) is enabled, and by switching to the 1-bit/n-cell mode, operation stability of one bit is enhanced, a cell current during a read operation is increased (the read operation is made high in speed), and self-correction of bit error is enabled; and a memory containing a program to execute a step of switching from the 1-bit/1-cell mode to the 1-bit/n-cell mode when an operating margin of the memory cells falls to no more than a predetermined threshold.

22. A computer comprising:
a plurality of semiconductor memory cells, each of the cells having: a pair of cross-coupled inverters with respective outputs connected to paths respectively leading to each of a pair of bit lines disposed in correspondence to a column of the memory cells; a pair of switch units disposed between the bit lines and the outputs of the inverters; and a single word line controllable by conduction of the switch units; and wherein dynamic switching between a mode in which one bit is allocated to one memory cell (1-bit/1-cell mode) and a mode in which one bit is allocated to n (where n is two or more) coupled memory cells (1-bit/n-cell mode) is enabled, and by switching to the 1-bit/n-cell mode, operation stability of one bit is enhanced, a cell current during a read operation is increased (the read operation is made high in speed), and self-correction of bit error is enabled; and a memory containing a program to execute a step of switching from the 1-bit/1-cell mode to the 1-bit/n-cell mode or from the 1-bit/n-cell mode to the 1-bit/1-cell mode when a condition with which a hold state of the memory cells is to be cancelled is established.

* * * * *